United States Patent [19]
Murphy-Boesch et al.

[11] Patent Number: 5,212,450
[45] Date of Patent: May 18, 1993

[54] RADIO FREQUENCY VOLUME RESONATOR FOR NUCLEAR MAGNETIC RESONANCE

[75] Inventors: Joseph Murphy-Boesch, Lafayette Hills; Ravi Srinivasan, Philadelphia; Lucas Carvajal, North Hills, all of Pa.

[73] Assignee: Fox Chase Cancer Center, Philadelphia, Pa.

[21] Appl. No.: 603,947

[22] Filed: Oct. 25, 1990

[51] Int. Cl.$^5$ .............................. G01R 33/20
[52] U.S. Cl. ...................... 324/322; 324/318
[58] Field of Search ............... 324/309, 318, 322, 300, 324/307, 319, 320, 316; 128/653.5

[56] References Cited

U.S. PATENT DOCUMENTS

| | | | |
|---|---|---|---|
| 4,439,733 | 3/1984 | Hinshaw et al. | 324/322 |
| 4,646,024 | 2/1987 | Schenck et al. | 324/318 |
| 4,680,548 | 7/1987 | Edelstein et al. | 324/318 |
| 4,692,705 | 9/1987 | Hayes | 324/318 |
| 4,694,255 | 9/1987 | Hayes | 324/318 |
| 4,737,718 | 4/1988 | Kemner et al. | 324/327 |
| 4,740,752 | 4/1988 | Arakawa et al. | 324/318 |
| 4,783,641 | 11/1988 | Hayes et al. | 333/219 |
| 4,825,163 | 4/1989 | Yabusaki et al. | 324/318 |
| 4,879,515 | 11/1989 | Roemer et al. | 324/318 |
| 4,885,539 | 12/1989 | Roemer et al. | 324/318 |
| 4,887,039 | 12/1989 | Roemer et al. | 324/318 |
| 4,929,881 | 5/1990 | Yabosaki et al. | 324/318 |
| 4,956,608 | 9/1990 | Dorri et al. | 324/318 |
| 4,992,737 | 2/1991 | Schnur | 324/318 |
| 5,041,790 | 8/1991 | Tropp et al. | 324/318 |
| 5,053,711 | 10/1991 | Hayes et al. | 324/318 |

FOREIGN PATENT DOCUMENTS 0303880 2/1989 European Pat. Off. ........... 324/318
293387 9/1988 Japan.

OTHER PUBLICATIONS

C. N. Chen, D. I. Hoult and V. J. Sank, J. Magn. Reson 54, 324–327 (1983). "Quadrature Detection Coils—A Further Square Root of Two Improvements in Sensitivity".
C. E. Hayes, W. A. Edelstein, J. F. Schenk, O. M. Mueller and M. Eash, J. Magn. Reson. 63, 622–628 (1985). "An Efficient, Highly Homogeneous Radiofrequency Coil for Whole-Body NMR Imaging at 1.5 T".
Alan R. Rath, J. Magn. Reson. 86, 488–495 (1990). "Design and Performance of a Double-Tuned Bird-Cage Coil" Also, ENC, Apr. 1989.
D. I. Hoult and R. E. Richards, J. Magn. Reson. 24, 71–85 (1976). "The Signal-to-Noise Ratio of the Nuclear Magnetic Resonance Experiment".
James Tropp, J. Magn. Reson. 82, 51–62 (1989). "Theory of the Bird-Cage Resonator".
Bottomley et al., Magn. Reson. Med. 7, 319–336 (1988). "Human in Vivo Phosphate Metabolite Imaging with $^{31}$P NMR".
M. D. Schnall, V. H. Subramanian and J. S. Leigh, Jr., J. Magn. Reson. 67, 129–134 (1986). "The Application of Overcoupled Tank Circuits to NMR Probe Design".
(List continued on next page.)

Primary Examiner—Michael J. Tokar
Attorney, Agent, or Firm—Dann, Dorfman, Herrell and Skillman

[57] ABSTRACT

An RF resonator mounted on a dielectric support is operated in quadrature at a selected NMR frequency. The resonator consists of four axially distributed high frequency ring current paths on the support and at least four high frequency current paths interconnect each pair of adjacent ring paths. In the preferred embodiment at least sixteen equally spaced parallel segments connect each ring pair and are aligned with one another. The ring segments between the parallel segments together with the parallel segments form loops. At least one discrete capacitor is placed in each outer current loop thereby interrupting the loop. However, this is done so that no inner loop is interrupted by a capacitor. By using quadrature input/output coupling, either inductive or capacitive, a co-rotating mode is excited in the two outer loops through the inner loops providing a highly uniform field across the resonator.

67 Claims, 11 Drawing Sheets

OTHER PUBLICATIONS

J. Murphy-Boesch et al., Abstract: Society of Magnetic Resonance in Medicine, Eighth Annual Meeting, vol. 2, p. 944, Society of Magnetic Resonance, Berkeley, Calif. 1989.

P. Joseph and D. Lu, IEEE Trans. Med. Imaging 8, 286-294 (1989). "A Technique for Double Resonant Operation of Birdcage Imaging Coils".

K. Derby, J. Tropp and C. Hawryszko, J. Magn. Reson. 86, 645-651 (1990). "Design and Evaluation of a Novel Dual-Tuned Resonator for Spectroscopic Imaging".

G. Isaac et al., J. Magn. Reson 89, 41-50 (1990) "A Design for a Double-Tuned Birdcage Coil for Use in an Integrated MRI/MRS Examination".

Donald W. Alderman and David M. Grant, J. Magn. Reson. 36, 447-451 (1979). "An Efficient Decoupler Coil Design which Reduces Heating in Conductive Samples in Superconducting Spectrometers".

V. J. Sank, C. N. Chen and D. I. Hoult, J. Magn. Reson. 69, 236-242 (1986). "A Quadrature Coil for the Adult Human Head".

RADIO FREQUENCY VOLUME RESONATOR FOR NUCLEAR MAGNETIC RESONANCE

Pursuant to 35 U.S.C. §202(c) it is hereby acknowledged that the U.S. Government has certain rights in the invention described herein, which was made in part with funds from the National Institutes of Health.

The present invention relates to an improvement in nuclear magnetic resonance (NMR) apparatus and, more particularly, to resonators for transmitting and/or receiving radio frequency (hereafter designated RF) signals characteristic of signals emitted by nuclei in NMR analyses. More specifically, the resonator of the present invention provides a high signal to noise ratio and enhanced control of the RF ($B_1$) field distribution with improved homogeneity in a selected region of interest.

BACKGROUND OF THE INVENTION

The NMR technique is based upon the magnetic properties of nuclei containing odd numbers of protons and neutrons. These nuclei possess an angular momentum related to the charge thereof. The magnetic moment is directed along the spin axis of each nucleus. When placed in a strong and generally homogeneous static magnetic field, designated $B_o$, the nuclei either align with or against the applied field and precess with a common sense about the applied field. The precessional angle of a nucleus may be changed by absorption of electromagnetic energy through a phenomenon known as nuclear magnetic resonance, NMR, which involves impressing upon the nuclei a second rotating magnetic field, designated $B_1$, of frequency to match that of their normal precession. When the applied RF magnetic field is removed, the nuclei precess and relax toward their equilibrium conditions, generating RF signals characteristic of the molecular environments in which the nuclei reside. The frequency at which they precess is known as the Larmor frequency and is given in annular frequency by $\omega = \gamma B$. $\gamma$, the gyromagnetic ratio, is a constant for each nucleus or nuclear isotope and generally results in widely separated Larmor frequencies for a given applied field strength, $B_0$. B is the magnetic field acting on the nuclei and is modified by the molecular environment of a nucleus according to $B = B_0(1-\delta)$. $\delta$ is the chemical shift offset impressed upon chemically equivalent nuclei by the local electronic distribution. Measured usually in parts per million, chemical shifts of a particular nucleus or nuclear isotope produce much smaller differences in frequency, and spectra derived from them can be used to obtain quantitative, structural, and dynamic information about the molecules of a sample. Because the Larmor frequency is proportional to the applied field $B_0$, the resonance frequencies of chemically equivalent nuclei will vary across the sample according to the strength of the magnetic field. It is only with technical difficulty that homogeneous $B_0$ fields are obtained, and high-field magnets are usually provided with electronic shim coils to counter both residual distortions of the magnet and the susceptibility distortions from sample or tissue being investigated or from materials comprising NMR probe. Acquisition of highly resolved spectra from a sample is usually preceded by a "shimming" procedure using a high sensitivity NMR signal from hydrogen protons or another abundant nucleus.

In performing medical NMR spectroscopy, the NMR instrument is generally configured to observe a single nucleus such as hydrogen protons (1H), phosphorus-31 (31P), or carbon-13 (13C). Since phosphorus containing metabolites are key indicators of the state of tissue, considerable effort has been directed towards acquiring and analyzing phosphorus spectra from tissue. Acquisition of high sensitivity phosphorus and other spectra from human tissue has been utilized for identifying and characterizing tissues and following their response to treatment. In another configuration, a bias or gradient in the normally homogeneous $B_0$ field is introduced across the sample for the purpose of spatially encoding information into the NMR signals. Images are later reconstructed from the information contained within this data, forming the basis of NMR imaging, a technique now widely used in medical diagnostics. The homogeneity of the $B_0$ field is reflected in the quality of its proton images, that is more homogeneous fields produce images with less distortion intensity.

The $B_1$ field for transmitting to the sample is derived most efficiently from a resonant RF coil placed in proximity to the sample and connected to the RF transmitting apparatus. Either the same or a second RF coil may be connected to the RF receiving apparatus to receive the NMR signals, which are induced in the coil by the precessing magnetism of the nuclei. Free induction signals from chemically shifted nuclei and from samples with $B_0$ field gradients impressed upon them are normally received with a single-resonant coil tuned to the Larmor frequency of the nucleus. The $B_1$ field generated by this receiving coil must be homogeneous over the sample to produce more uniform spectral measurements and images.

It well known that improved sensitivity and a reduction in transmitter power can be obtained if a coil can be operated in circularly polarized mode. See C.-N Chen, D.I. Hoult, and V.J. Sank, J. Magn. Reson 54, 324–327 (1983). A linear oscillating field, such as produced by a simple resonant coil, can be cast as the sum of two circularly polarized components of equal amplitude. Likewise, by combining out of phase the linearly oscillating fields of two well-isolated, single-tuned crossed coils or the well-isolated fundamental modes of a multi-modal structure such as the "birdcage" coil, described later, a single, circularly polarized magnetic field can be produced which matches the precessional motion of the nuclei. Circularly polarized coils are similar to crossed-coil double-tuned probes in that two resonant circuits require tuning. They differ, however, in that being of the same frequency, they require a high degree of electrical isolation to operate independently, as will be shown later.

With the conventional "birdcage" coil, improved homogeneity in planes perpendicular to the coil axis is achieved with currents distributed sinusoidally in the straight conductors of the coil. The finite length of the straight conductors and the currents flowing in the end rings contribute to an inhomogeneous field in the interior of the coil. Improved homogeneity parallel to the coil axis is obtained by increasing the coil length thereby increasing the length of the straight conductors and moving the end rings away from the coil center. A trade-off exists, however, since lengthening the coil reduces the coil sensitivity. The resonator of the present invention redistributes the currents in the coil, concentrating them in two bands of conductors at either end. $B_1$ homogeneity is thereby improved along and in the region of the longitudinal axis without increasing coil length. By maintaining the sinusoidal current distribution about the coil axis, homogeneity in planes perpendicular to the coil axis is maintained.

It is therefore an object of this invention to provide an RF resonator with currents concentrated in outer bands of the coil to provide a more homogeneous field profile along and in the region of the coil axis.

It is another object of this invention to provide an RF resonator with currents distributed sinusoidally about the coil axis to provide a substantially homogeneous $B_1$ field in planes perpendicular to the coil axis.

It is another object of the invention to provide an RF resonator capable of circularly polarized operation with improved signal to noise ratio over volume of interest.

It is yet another object of this invention to provide an RF resonator with plurality of conductors employed to construct the coil and tuning capacitance distributed along the outer bands such that the entire coil resonates at any one given NMR frequency.

SUMMARY OF THE INVENTION

The present invention has a primary purpose to provide a volume resonator capable of operating in quadrature or circularly polarized mode at any given NMR frequency.

The advantage of the resonator of the present invention may be summarized as follows:

(1) Currents concentrated in outer structures of the coil provide a more homogeneous RF $B_1$ field in the coil center along and in the region of the longitudinal axis with steeper roll-offs of the field near the coil ends.

(2) Currents concentrated in the outer structures are coupled in-phase through the inner structure, thereby allowing a fraction of their currents to flow across the inner structure.

(3) With the outer structures strongly coupled through the resonator, currents in the inner structure follow the same sinusoidal distribution of the outer structures, thereby providing a homogeneous $B_1$ field in planes perpendicular to the coil axis.

(4) Improved sensitivity or signal-to-noise ratio of received signals from the resonator when operated in circularly polarized mode.

(5) Reduced transmitter power requirement when operating the resonator in circularly polarized mode.

Thus, these resonators are to be useful in both the clinical and high-field research environments. In clinical NMR these resonators can be used as body coils in whole-body NMR machines. The resonator of the present invention can also be designed for imaging and spectroscopy studies of human head and extremities of the human body. In the high-field research environments this resonator is expected to have early application to animal studies and large volume samples, especially in vivo studies of animals, perfused blood cells and tissues Reduced scale designs will be useful with 5 mm and 10 mm sample tubes. Later applications are expected in the highest field, high-resolution spectroscopy probes, such as the currently available 600 Mhz instrument.

More specifically the present invention relates to an RF volume resonator of generally cylindrical form for use in NMR. The resonator has four ring high frequency current paths. The resonator also has three sets of generally parallel paths in each set being equally spaced from one another. Adjacent paths and adjacent rings thereby form current loops. At least one discrete capacitor is interposed in each outer loop in each of the parallel paths, whereby in combination with the inductance in each loop, including inherent inductance in conductors, resonant loops are formed. However, the capacitors are located so that none of the inner loops contains a capacitor so that each inner loop alone has no resonant frequency. The loops between the inner and outer rings repeat about the axis of the cylinder to form a multi-resonant coil. A single quadrature mode of the coil provides a homogeneous RD $B_1$ field for use at an NMR frequency.

DRAWINGS

For a better understanding of the present invention reference is made to the following drawings:

FIG. 3b is a portion of the developed schematic equivalent circuit of the capacitor containing cylindrical resonator meshes of FIG. 3a;

FIG. 3d is a plot of reflected power vs. frequency response of the circuit of FIGS. 3a–3c with the coupling inductive loop placed over the low-pass portion of the resonator shown in FIG. 3a;

FIG. 4b is an individual repetitive circuit unit of the circuit of FIG. 4a;

PRIOR ART

Figure 1:
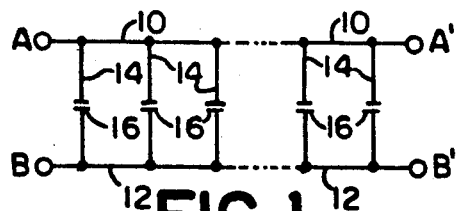
FIG. 1 is a developed partial schematic for a prior art low pass birdcage coil.

The applied field $B_o$ by convention is considered to be directed in and defining the Z-direction for NMR. RF coils that are a part of a simple resonant circuit, have a single distribution of current oscillating in phase and produce a linearly polarized RF magnetic field, $B_1$, at each point in the sample. The linearly oscillating component of $B_1$ transverse to the applied field $B_o$, that is $B_{1xy}$, nutates the nuclei in a predetermined manner during transmission. Likewise, by the principle of reciprocity, the coil receives signals from nuclei of the sample with a profile weighted by the magnitude of $B_{1xy}$ See D.I. Hoult and R.E. Richards, J. Magn. Reson. 24, 71-85 (1976).

As stated above, improvement in NMR probe transmission efficiency can be obtained by the use of a coil structure which creates within the sample a circularly polarized $B_1$ field transverse to the applied field $B_o$. We consider now a coil structure capable of developing in the region of the sample two spatially orthogonal, linearly oscillating $B_1$ fields, each driven independently by one radiofrequency port. Within a linear oscillating field, transmitter power is divided equally between left-hand and right-hand circular polarizations. Since only one of these polarizations matches the precessional motion of the nuclei, a factor of two reduction in required transmitter power can be achieved by direct generation of the single polarization. By reciprocity, the signal detected from the sample will likewise double. Noise from the two linear channels used to detect each linear polarization, on the other hand, is uncorrelated and therefore increases by a factor of square root of two upon being summed, for example within a quadrature hybrid. A net increase of square root of two in sensitivity can thus be obtained by use of a circularly polarized coil.

A simple embodiment of a circularly polarized coil is two identical circular loop coils positioned with a common origin and oriented 90 degrees with respect to one another. If two transmitting signals electrically 90 degrees out of phase are applied to the respective ports of each single-tuned coil, a single circular polarization will be generated at the center of the two coils. In the same manner, when free-induction signals from each port of the coils are combined in quadrature, or 90 degrees apart, only a single polarization is detected from the sample. Another embodiment of a circularly polarized coil is the "birdcage" resonator, so called because of its appearance. See C.E. Hayes et al., J. Magn. Reson. 63, 622-628 (1985) and U.S. Pat. Nos. 4,692,705 and 4,694,255. A distributed inductance-capacitance structure of this type characteristically has a number of electrical modes. Most of the modes of this resonator, including the fundamental electrical $k=1$ mode, have two linearly oscillating "X" and "Y" modes which are spatially orthogonal modes in the interior of the coil and occur at approximately the same frequency. See J. Tropp, J. Magn. Reson. 82, 51-62 (1989). These modes, by virtue of their sinusoidal distribution of current around the coil periphery, provide a homogeneous $B_1$ field across the sample. See also Hinshaw Patent No. 4,439,733.

It is very important that matching circuitry couple only to their respective electrical modes; coupling of a given port to both electrical modes will quickly degrade either transmitter or receiver efficiency, depending upon the relative polarity of the coupling. The electrical isolation measured between the coupling ports is a measure of the degree to which each port couples only to its designated ($k=1$) mode. Variable capacitors mounted about the periphery of the coil are used to rotate and align the spatial modes. The resonator may be driven in circularly polarized mode either capacitively across the input/output coupling points as shown in FIG. 2b or inductively with coupling loops like the one shown in FIG. 3a, spaced 90 degrees apart. When the modes are properly aligned, the ports couple only to their respective modes, and a high degree of electrical isolation between the ports is achieved. Under the condition of weak coupling between matched ports, the ratio of the output voltage to the input voltage at the other port is $\kappa Q/2$, where $\kappa$ is magnetic coupling coefficient and Q is the circuit Q. For high Q coils, a high degree of mode isolation is thus required to reduce the voltage ratio to a value much less than one. In practice, we have found that this value should be 0.03 ($-30$ dB) or greater for superior transmitter/receiver performance.

FIG. 1 is a partial planar schematic of a birdcage coil. It effectively involves a pair of closed ring conductors 10 and 12 having uniformly spaced identical connecting conductors 14, each of which contains a bypass capacitor 16. The coil illustrated in FIG. 1 is typically utilized in NMR studies of the head. Owing to the sinusoidally distributed currents in the straight segments of the coil, the radial homogeneity of the birdcage coil is greatly improved over saddle coils, especially in annular regions of the coil interior close to the coil conductors. See U.S. Pat. No. 4,694,255. Homogeneity is further improved in the latter regions by increasing the number of straight segments 14, for example from eight to sixteen. For a birdcage coil having a length equal to or less than its diameter, the RF $B_1$ field profile along the longitudinal coil axis is Gaussian like in shape, falling off from its maximum near the coil center to about half its maximum near the ends of the coil. RF $B_1$ field homogeneity along the coil axis is improved by increasing the coil length. Greater field homogeneity is obtained at the expense of coil sensitivity, however, since the extra length of the coil will incur greater resistive losses, both in the sample, or tissue, and in the conductors of the coil. See Bottomley et al., Magn. Reson. Med. 9, 319–336 (1988). This loss in coil sensitivity is not acceptable for our in-vivo NMR studies of the head, where low signal to noise ratio data from multiple regions of the head provide useful information.

It is therefore apparent that the current distribution needs to be controlled in the coil structure to provide a uniform $B_1$ field. It is also apparent that the coil must have adequate sensitivity over the sample under investigation.

SPECIFIC DESCRIPTION OF THE INVENTION

Figure 2A:
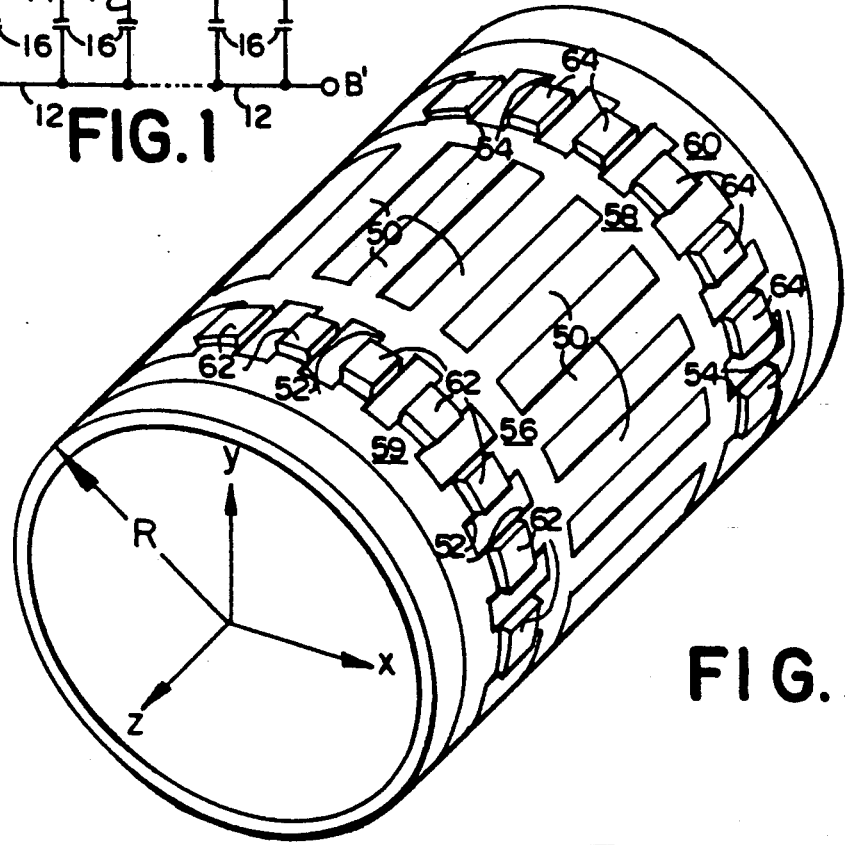
FIG. 2a is a perspective view of a preferred physical embodiment of a sixteen segment four-ring low-pass RF resonator in accordance with the present invention.
Figure 2B:
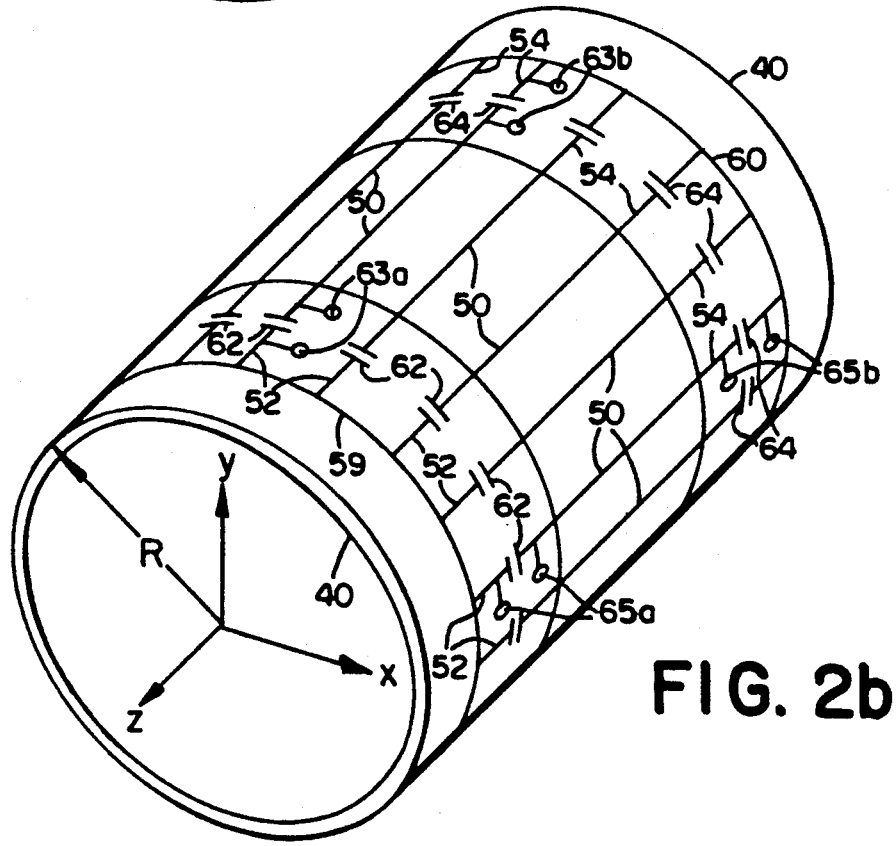
FIG. 2b is a similar view of the resonator of FIG. 2a as a schematic circuit, but showing the location of capacitors and input/output coupling points.

The preferred embodiment of the RF resonator of the present invention, shown in FIG. 2a and shown schematically in FIG. 2b, may be referred to as a "four ring" birdcage resonator. In this regard the geometry closely resemblies that of our RF resonator disclosed in our co-pending U.S. patent application Ser. No. 561,898 filed Aug. 2, 1990. The four conductive rings 59, 56, 58, 60, which are coaxial, of the same diameter, and spaced along the coil axis to define the cylinder of the "birdcage", are needed to achieve the aims enumerated above. This embodiment is preferred on two counts: first because it is electrically different from the prior art and second because of the specific form that it assumes similar to that of the preferred embodiment in out application Ser. No. 561, 898. Relative to the form, it can be seen in FIG. 2a that a coil is supported on a thin walled tube 40 of a preferably transparent insulating material. It is also preferably capable of being made of sufficiently large size to permit a patient's head to be placed within the tube. The outer cylindrical surface of the tube is covered with a foil or sheet 42 which has through it a plurality of rectangular or oblong openings 44, 46, 48. In this case the openings are aligned along elements of the cylinder and the central opening 44 is of the same width circumferentially and in general, but not necessarily, of the same length axially from openings 46 at one end and opening 48 at the other. The openings 44, 46 and 48, respectively, are arranged around the circumference equally spaced from one another. The openings are not only equally spaced from one another and uniform in size, but the conductive segments 50, 52 and 54, respectively, between them are uniform. Between openings 44 and 46 is circumferential continuous ring 56 and between openings 44 and 48 continuous ring 58. At the outside edges are continuous rings 59 and 60, respectively. Strip segments 50 between continuous rings 56 and 58 are uninterrupted but strip segments 52 and 54 are interrupted by gaps which are similarly bridged by capacitors 62 and 64, respectively.

While the preferred embodiment of the RF resonator has been described in terms of a flat sheet formed about a tubular support, it will be understood by those skilled in the art that the conductors may be made up of individual conductive elements which are wires, conducting tubes, flat conducting tapes or any combination thereof.

In the preferred embodiment of FIG. 2b, a pair of low-pass outer structures resonant at a selected frequency are separated by non-resonant loops defined by the two inner rings 56, 58, and the conductive segment connections 50 between them. The conductive segments are parallel to the longitudinal axis of the coil and to one another and are evenly spaced around the cylinder they define with the rings. The section of the coil formed by the inner, evenly spaced pair of conductive rings and the evenly spaced conductive segments connecting them will hereafter be referred to as the "inner structure". Two outer resonant structures share common rings 56,58 with the inner structure. Extending between inner rings 56,58 and outer rings 59,60 are conductive segments 52,54. The segments 52,54 are parallel to the longitudinal axes of the coil and to one another and are evenly spaced around the cylinder they define with the rings. The capacitors 62,64 are added in the conductive segments 52,54 respectively. Using only one set of capacitors 62 or 64 at a time, each "outer structure" of the coil resonates with the same number and distribution of modes with each mode resonating approximately at the same frequency. Conductive segments 50 of the inner structure and 52,54 of the outer structure are parallel to the longitudinal axis of the resonator and in this embodiment are in line with one another. Input and output coupling to the resonator may be either inductive or capacitive. In FIG. 2b capacitive coupling for circularly polarized operation is accomplished using input/output terminals 63a or 63b or both at a selected frequency and input/output terminals 65a or 65b or both at the same frequency 90° out of phase. Operation in linearly polarized mode is accomplished using only one set of terminals 63a, 63b or 65a, 65b.

Figure 3A:
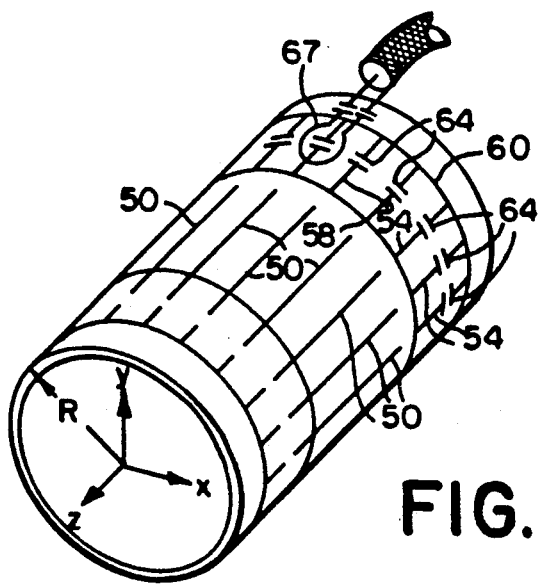
FIG. 3a is a schematic diagram showing for analysis the capacitors of one of the outer low pass volume resonator capable of operating independently.
Figure 3C:
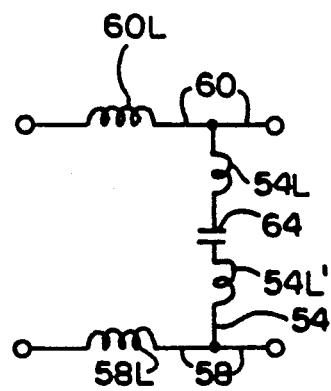
FIG. 3c is an individual repetitive circuit unit of the circuit of FIG. 3b.
Figure 3B:
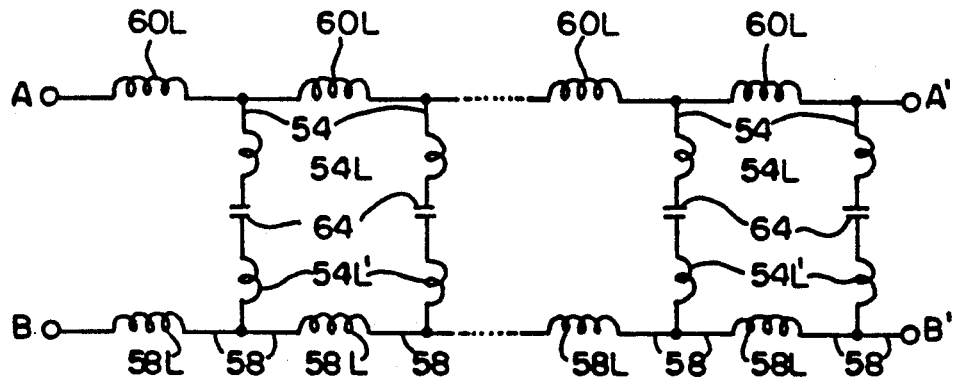
Figure 4A:
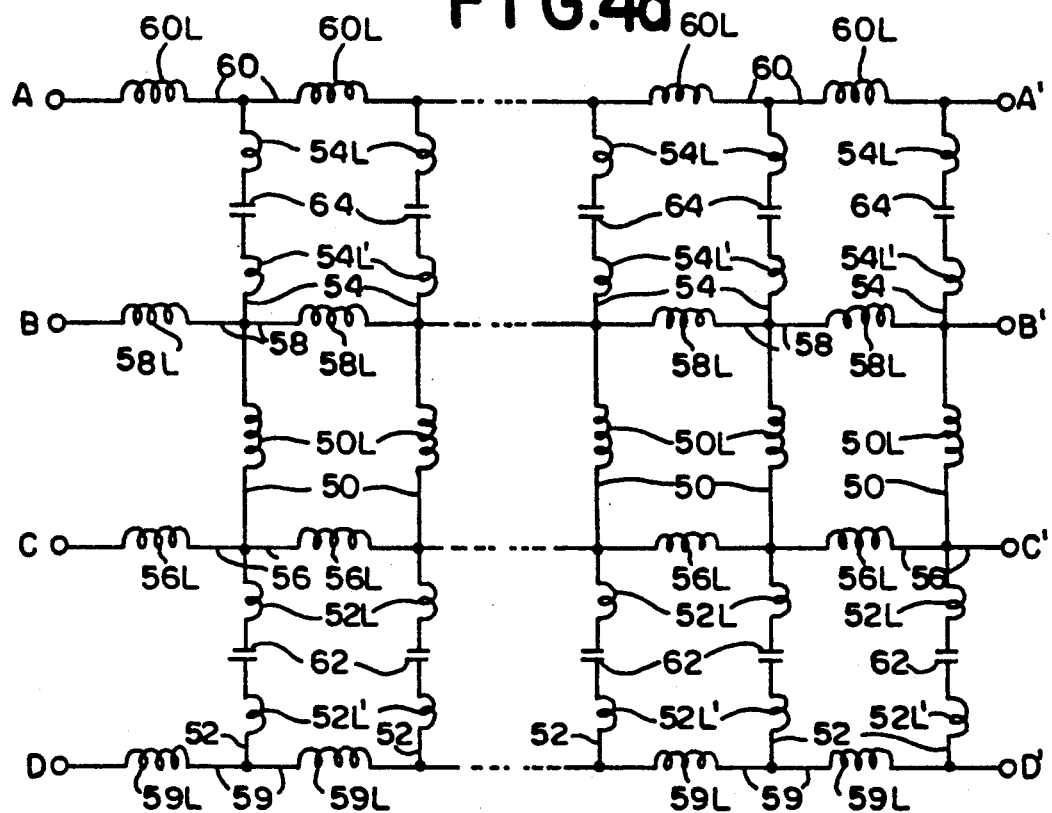
FIG. 4a is a portion of the developed schematic equivalent circuit for the total RF volume resonator shown schematically in FIG. 2b, including all capacitors in the structure.
Figure 4B:
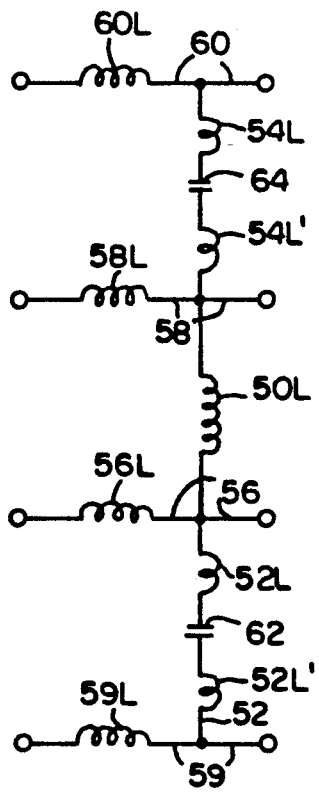

A better understanding of the coil depicted schematically in FIG. 2b can be acquired by study of the lumped-element equivalent circuits of each of the outer structures shown in FIGS. 3a–3c and the composite structure formed by joining the structures together seen in FIGS. 4a and 4b. The lumped element inductances are shown as the number of the segment in which they appear with the suffix L, i.e., 50L, 56L, 58L, 59L, 60L or in those cases where a capacitance splits a segment by L and L', i.e., 52, 52L', 54 and 54L.

Figure 3D:
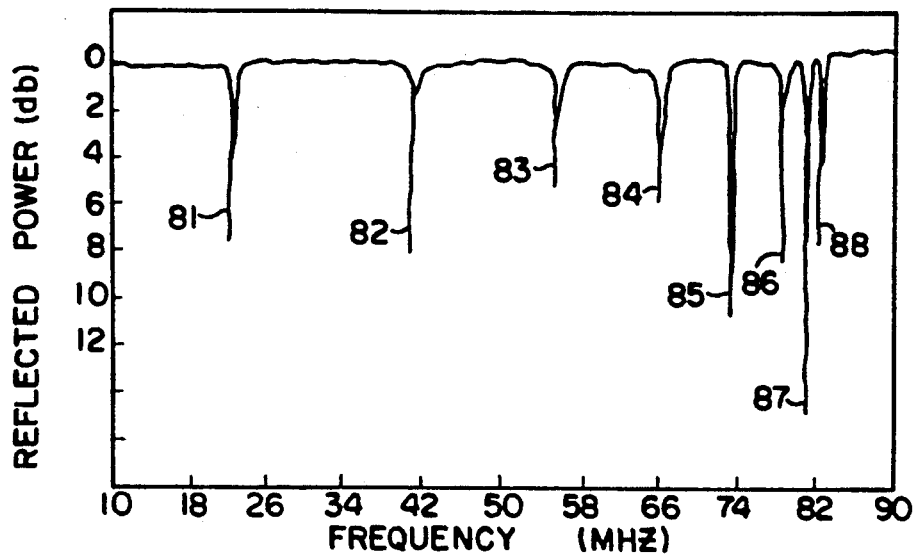

Referring to FIG. 3a representing a physical embodiment of the preferred sixteen segment resonator structure with capacitors supplied at only one end for the purpose of analyses, each outer structure is capable of operating independently as a low-pass volume resonator, where the capacitors 64 are mounted across a gap in each conductive segment 54. In the absence of capacitors 62, no current will flow in the opposite outer structure. FIG. 3a is the lumped-element equivalent circuit of one outer resonant structure of the four ring low-pass volume resonator shown in FIG. 3a. The complete circuit of the outer structure is formed by joining terminals A and B to terminals A' and B', respectively. The ladder network is made up of sixteen repeat circuit units shown in FIG. 3c. Inductors 60L represent the inductance associated with each end conductive ring segment 60 and inductors 58L that of the adjacent inner conductive ring segment 58 shared with the inner structure. These inductors are all mutually inductively coupled. Likewise, inductors 54L and 54L' associated with the cylinder element conductive segment 54 of the outer structure are all mutually inductively coupled. The network of FIG. 3b is referred to as a "low-pass" structure because of the similarity of the repeat circuit unit with a conventional low-pass filter network. At a given frequency, the voltage through the repeat circuit element will be phase shifted by $\Delta\theta$. The coil of FIG. 3b will resonate only when the accumulated phase shift between terminals A-A' and B-B' is an integral multiple of $2\pi$ radians. That is, for a coil with N conductive segments, $N \Delta\theta = k2\pi$, where $N/2 > k > 1$. The structure of FIG. 3b is equivalent to a "forward wave" transmission line and will exhibit an increasing phase shift $\Delta\theta$ for each circuit unit of FIG. 3c with increasing frequency. Higher order modes occur therefore at correspondingly higher frequencies as shown by the reflected power measurements of FIG. 3d. Referring to FIG. 3d, eight modes 81, 82, 83, 84, 85, 86, 87, 88 were measured for this sixteen segment low-pass structure using an eight centimeter diameter inducting loop 67 placed over and centered upon one of the capacitors 64. The y-axis is the reflected power from the loop as measured using an impedance bridge and a Hewlett-Packard 4195A Network Analyser. The valves of the capacitors 64 were about 127 picofarads. Of these modes, only the $k=1$ modes produce a homogeneous RF field in the region of the coil center. The $k=1$ mode 81 is a quadrature mode, that is, it is in general comprised of two orthogonal or independently operating "X" and "Y" modes producing respectively about the coil axis sinusoidal and cosinusoidal current distributions in the conductive elements of the coil. The latter produce respectively two linearly oscillating and perpendicular $B_1$ fields in the interior of the coil. Higher order modes ($k > 1$) produce inhomogeneous RF fields, all of which have nulls in amplitude at the coil center of FIG. 3a. For an ideal resonator with N-fold symmetry about the coil axis, that is, a coil having equal size capacitors, equal size and equally spaced conductive segments, equal conductive end ring segments, and equal size conductive inner ring segments, the $k=1$ modes will be indistinguishable, resonating at the same frequency and having no preferred orientation. In the usual occurrence of slightly non-symmetric coil, the modes will be linear and spatially orthogonal to one another, will have preferred orientations, and will resonate at slightly different frequencies. The coupling 67 shown in FIG. 3a is inductive, with a single inductive coupler suitable for coupling to a single linearly polarized mode of the coil. Coupling to both linear polarized modes of the coil for circularly polarized operation requires two such couplers spaced 90° apart about the coil axis.

The network of FIG. 4a is the lumped-element equivalent circuit of the resonator invention shown in schematic form in FIG. 2b. The complete circuit of the resonator is formed by joining terminals A, B, C, and D to terminals A', B', C' and D', respectively. The composite balanced ladder network of FIG. 4a is comprised of sixteen repeat circuit units shown in FIG. 4b. With all capacitors attached and all current paths completed, the two outer structures of the resonator of the present invention couple via additional mutual inductances and additional circuit connections. Because the inner structure shares common inner ring segments 56 and 58 with the respective outer structures, the inductive couplings between the inner structure and each outer structure are strong. Owing to their separation, the two outer structures are only weakly mutually inductively coupled. This has been confirmed by breaking the inner segments 50 and activating in sequential fashion the two outer structures, installing first capacitors 62 and then 64. At a resonance frequency of 22 MHz only a small splitting in frequency (0.6 MHz) in the $k=1$ mode 81 of FIG. 3d of the coupled outer structures was observed upon activating the second outer structure. As will be shown below, a much stronger coupling of the two outer structures occurs through the conductive inner segments 50.

Figure 4C:
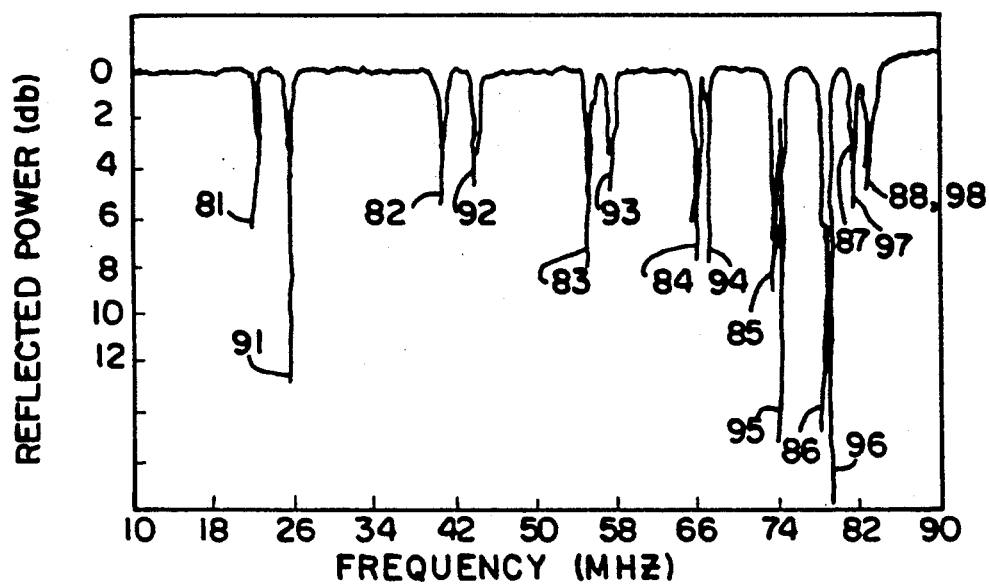
FIG. 4c is a plot of reflected power vs. frequency response of the circuit of FIGS. 4a and 4b using an inductive coupling loop placed over one outer structure.
Figure 4D:
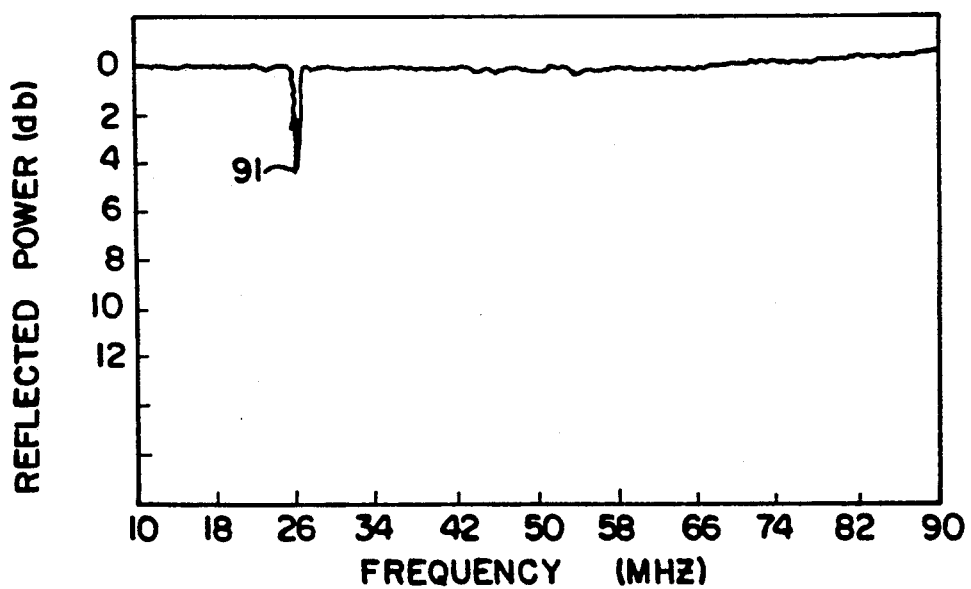
FIG. 4d is a plot of reflected power vs. frequency of the same circuit using an inductive coupling loop placed in the center of the resonator.

No formal analytic theory exists for a composite volume resonator of the present type. Described below, however, are general features of its operation and demonstration of these features with measurements of a specific resonator. The modes of FIG. 3d were observed by activating one of the outer structures. Upon adding 127 picofarad value capacitors 62 and 64 to both outer structures, 16 discrete resonances were observed. These resonances were observed by the same inductive coupling loop 67 as shown in FIG. 3a. Of these 16 modes the eight modes 81, 82, 83, 84, 85, 86, 87, 88 are referred to as the "counter-rotating" modes and the other eight modes 91, 92, 93, 94, 95, 96, 97, 98 are referred to as the "co-rotating" modes, as will be explained below. Comparing the positions of the modes of FIG. 3d to those of FIG. 4c, the effect of activating the outer structures is to shift the counter-rotating $k=1$ mode 81 and counter-rotating $k=2$ mode 82 to slightly lower frequency (0.2 MHz); counter-rotating $k=3$ to $k=8$ modes 83, 84, 85, 86, 87, 88 remain almost unaffected. FIG. 4d is a graph of reflected power response versus frequency for the fully activated four ring low pass resonator with the same inductive loop 67 not shown. At the center of the volume resonator only one mode, the co-rotating $k=1$ mode 91, is observed; only this mode is observed because of its sinusoidal distributed currents about the entire coil periphery and the only one therefore to provide a detectable and homogeneous $B_1$ field in the coil center.

Figure 5A:
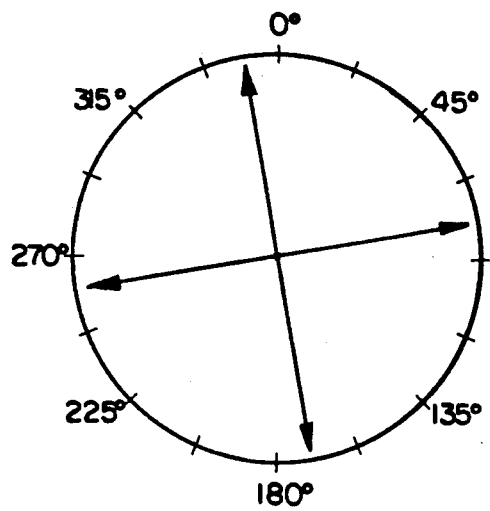
FIG. 5a shows, for example, natural orientation of the orientation of the two linear "X" and "Y" K=1 modes of the first of the two low pass resonators capable of operating near 22 MHz.
Figure 5B:
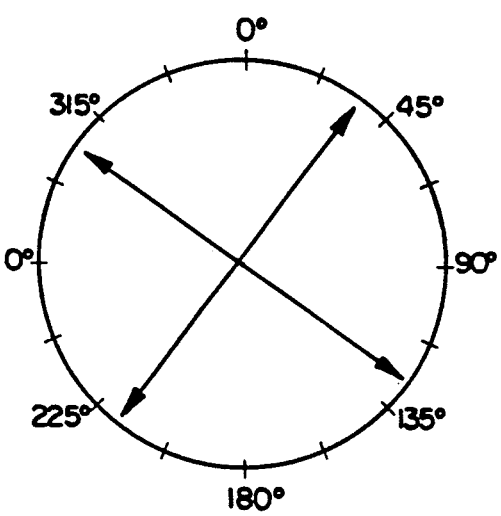
FIG. 5b shows, for example, natural orientations of the two linear "X" and "Y" K=1 modes of the second low pass resonator capable of operating near 22 MHz.
Figure 6A:
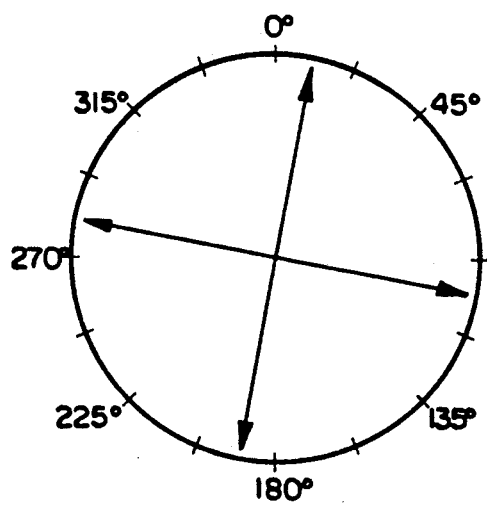
FIG. 6a shows, for example, natural orientations of the counter-rotating "X" and "Y" fundamental modes the resonator of operating near 22 MHz resulting from the outer structures of FIG. 5a and 5b strongly coupled through the inner structure.
Figure 6B:
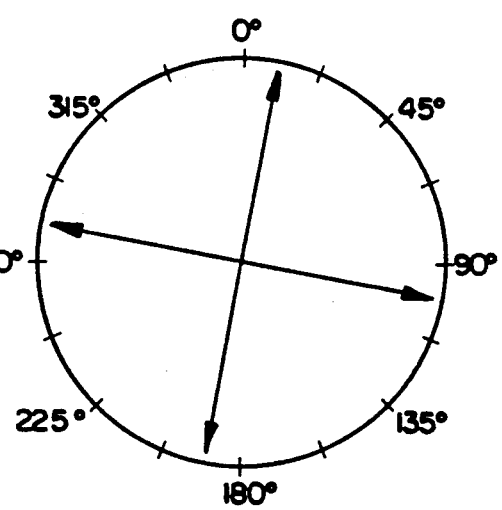
FIG. 6b shows, for example, the natural orientations of the co-rotating "X" and "Y" fundamental modes of the resonator operating independently near 25 MHz resulting from the outer structures of FIG. 5a and 5b, strongly coupled through the inner structure.

With a single outer structure activated using one set of capacitors 62 or 64 in the form shown in FIG. 3a, the $k=1$ mode pair will have its own preferred orientation, as shown in FIG. 5a. This orientation reflects small variations in the capacitive elements and conductors which disturb the symmetry of the coil about the coil axis. With capacitors of the first outer structure removed, the second outer structure will also have a preferred orientation of its $k=1$ modes with a second set of capacitors mounted at designated locations. With capacitors mounted on both the outer structures and upon reconnecting the conductors 50 of the inner structure, the $k=1$ mode pairs of each outer structure over-couple and lock in orientation, as shown in FIGS. 6a and 6b. Upon locking in orientation, two new mode pairs are formed which span the length of the coil. FIGS. 6a and 6b depict only two $k=1$ mode pairs, since the outer structures operate in concert with one another. Overcoupling through the inner structure also causes a frequency splitting of the new modes in much the same manner as simple resonant circuits (See M.D. Schnall et al. below). This frequency splitting for new $k=1$ mode pairs have the same radial orientation and sinusoidal current distributions as illustrated in FIGS. 7a and 7b, respectively.

Figure 7A:
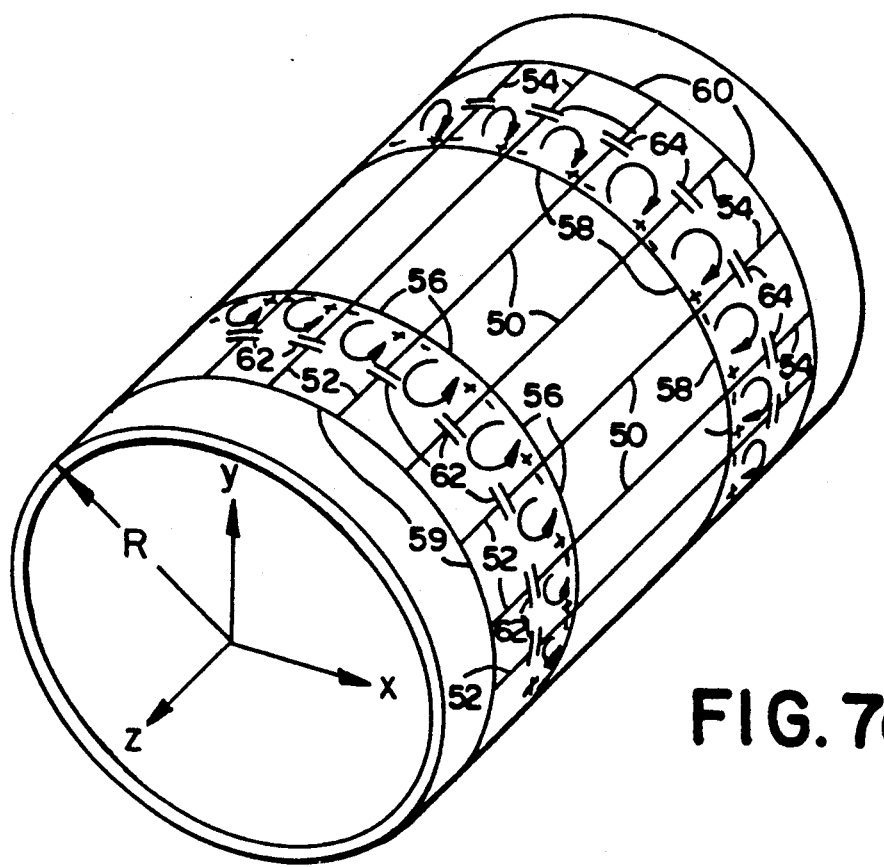
FIG. 7a illustrates the sinusoidally distributed counter-rotating currents of one linear mode in the outer structures and the electric potentials of similar polarity developed therein across the inner structure due to the currents in the two outer structures.
Figure 7B:
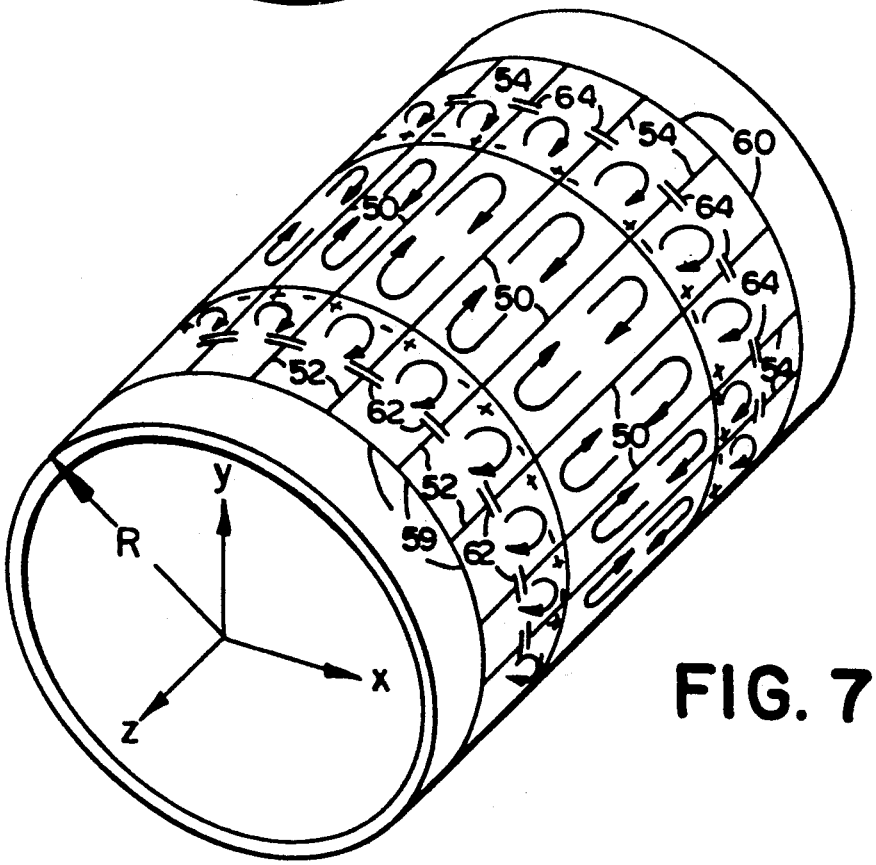
FIG. 7b illustrates the sinusoidally distributed co-rotating currents of one linear "X" and "Y" mode in the outer structures and the electric potentials of opposite polarity developed therein across the inner structure thereby allowing current to flow across the conductive segments of the inner structure.

The modes of FIG. 7a are referred to as the counter-rotating $k=1$ modes, since the currents in each outer structure have opposite senses. According to the right-hand rule, they produce RF fields in the coil having opposite directions. The RF fields of these modes produce a linear gradient in RF intensity along the longitudinal axis and therefore a null in RF field intensity at the center of the coil. This RF field gradient may be useful in rotating frame experiments by providing spatial selectivity in the Z-direction. As indicated in FIG. 7a, the sense of the currents in each outer structure is also such as to produce no net voltages across the inner ring segments 56 and 58. Thus with no currents flowing within the coupling inductances of the inner structure, the counter-rotating k=1 modes 81 of FIG. 4c have resonant frequencies very close to the k=1 modes 81 of an isolated resonant outer structure as shown in FIG. 3d with broken inner conductive segments 50. The mode of FIG. 7b is referred to as the co-rotating k=1 low-pass mode, since the currents in each outer structure have the same sense and, according to the right-hand rule, produce RF fields in the coil having the same direction. As indicated in FIG. 7b, the sense of the currents in each outer structure is such as to produce cooperative voltages across the inner ring segments 56 and 58 causing currents to flow through the inner segments 50 of the inner structure. The intensity of the mesh currents within the inner structure segments 50 will be smaller than those of the outer structure, since the inner structure serves only to couple the outer structures, but they will have the same sinusoidal distribution in intensity as the currents in the outer segments 52 and 54. The effect of currents flowing through the inner structure is to improve the RF field homogeneity along and in the region of the longitudinal axis. Since the effect of the inner structure is to provide inductive coupling of the outer structures (as opposed to capacitive coupling) the frequency of this co-rotating k=1 mode 91 is shifted upward (as opposed to downward) from the counter-rotating k=1 mode 81. See M.D. Schnall et al., J. Magn. Reson, 67, 129–134 (1986). For this embodiment, we have found that the capacitors should be approximately 125 picofarads to resonate the co-rotating k=1 mode 91 at 26 MHz for phosphorus nuclei, the resonant frequency for a static field $B_0$ of 1.5 Tesla. The counter-rotating mode 81 was found to have a frequency of 22 MHz.

A homogeneous $B_1$ field will produce a more uniform distribution of nutation angles during transmission and, by reciprocity, a more uniform receiver response. It is well known that a sinusoidally distributed DC current flowing on the surface of a cylinder and parallel to its longitudinal axis will produce within the interior of the cylinder a completely uniform static magnetic field oriented transverse to the coil axis. The birdcage resonator approximates this continuous surface current distribution at RF frequencies by sinusoidally distributing current in equally spaced and fixed length straight conductors located on the surface of a cylinder. Homogeneity is increased radially about the coil longitudinal or Z-axis by increasing the number of conductive segments between the end conductive rings. For the preferred embodiment a sixteen segment coil was chosen to provide RF field homogeneity over the region occupied by the human head using a 27 cm diameter cylinder.

Figure 8A:
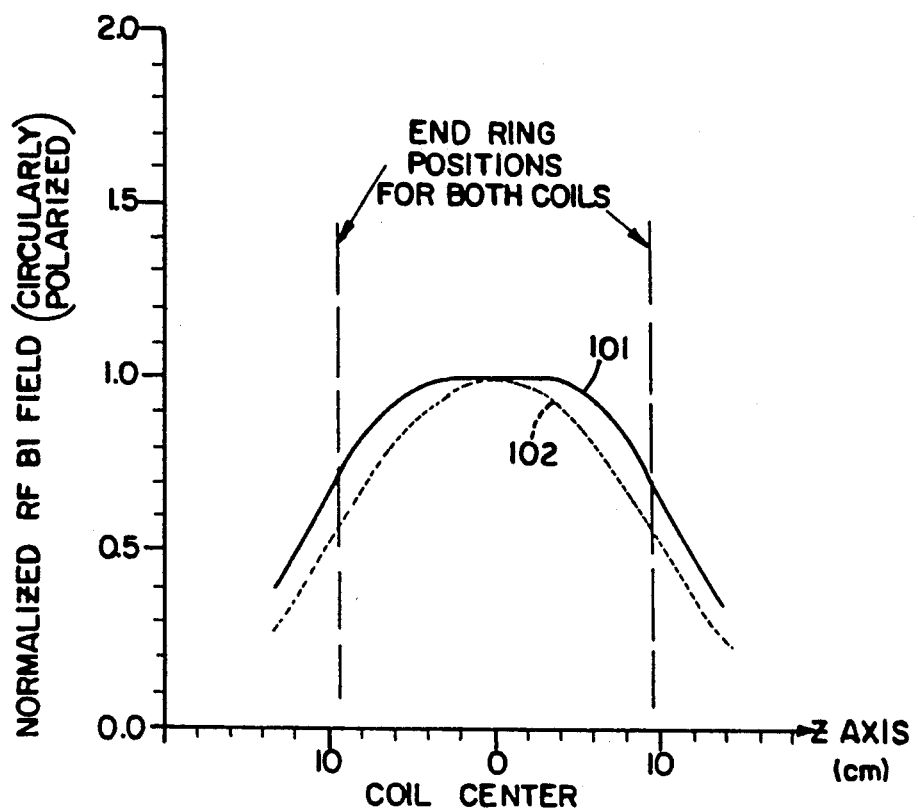
FIG. 8a illustrates normalized RF $B_1$ fields along the Z axis for the prior art coil shown in dashed lines and for this resonator of the present invention shown in dark lines.

Along the Z-axis of the prior art coil, the $B_1$ field 102 has a shape that is Gaussian in character falling to about one half its maximum near the ends of the coil, as indicated in FIG. 8a. Improved homogeneity in the direction of the coil axis is obtained by increasing the coil length, thereby better approximating the effect of a very long coil. A trade-off exists, however, since lengthening the coil excessively, i.e. much beyond about one diameter, reduces sensitivity (per unit volume) within the coil. See Bottomley et al., above. As shown in FIG. 7b, the resonator of the present invention concentrates the currents in the outer structures of the coil, thereby contributing more $B_1$ field strength near the ends of the coil. A smaller amount of current flows through the inner structure, maintaining field strength in the center region along the coil axis. The homogeneity is thereby improved along and in the region of the coil longitudinal axis, as shown by the $B_1$ field 101 in FIG. 8a, without increasing the coil length. Currents in both the outer structures and the inner structure are sinusoidally distributed about the coil axis and electrically in-phase with one another. The straight segment currents in each outer structure for an N segment four ring resonator are given by $$I_n^{so} = I_o \sin\left(\frac{2\pi}{N}\right)\sin\left(\frac{2\pi n}{N}\right)$$

where n=0, 1, 2, ... N−1 is the conductive segment number, an inductive drive 67 is centered upon the n=0 conductive segment and $I_o$ is a constant current. See J. Tropp, above. Similarly, the currents in the end conductive rings 59 and 60 are of opposite sense and have magnitudes $$I_n^{ro} = I_o \cos\left(\frac{\pi}{N}\right)\cos\left(\frac{\pi(2n-1)}{N}\right)$$

Because the inner conductive segments serve to couple strongly the outer structure, a fraction p of the currents flowing in the outer conductive segments 52, 54 flows in each of the respective inner conductive segments 50. The inner segment currents are therefore given by $$I_n^{si} = p\, I_o \sin\left(\frac{2\pi}{N}\right)\sin\left(\frac{2\pi n}{N}\right)$$

Figure 8B:
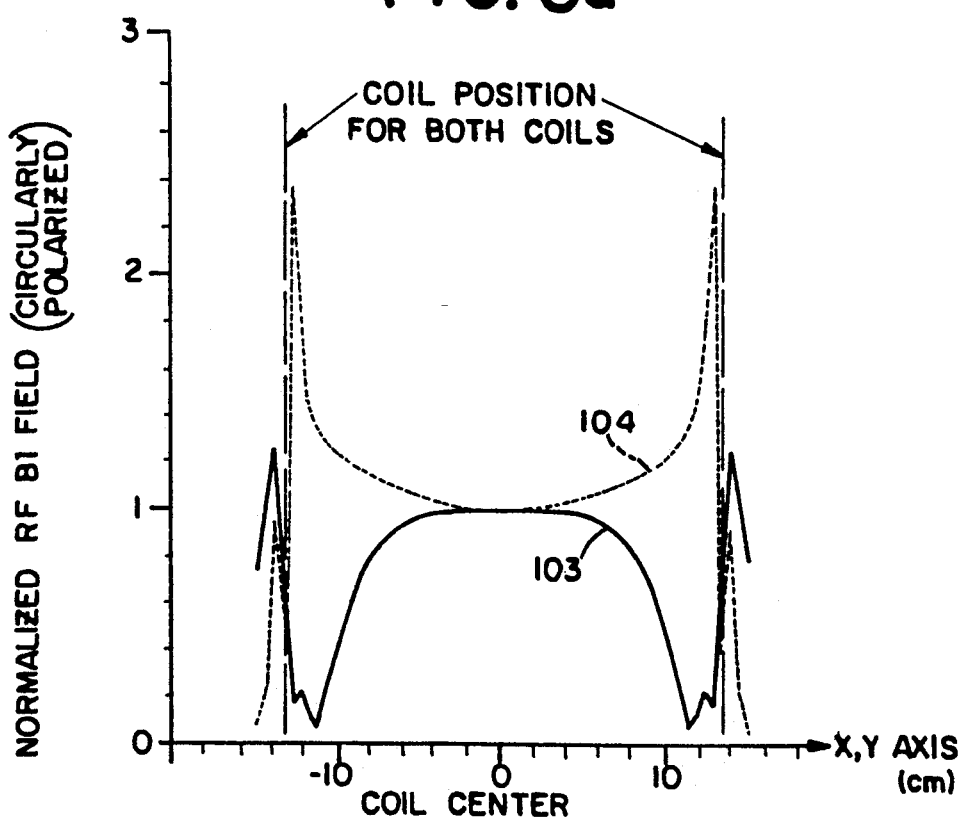
FIG. 8b illustrates normalized RF $B_1$ fields along the X,Y axis for the prior art coil shown in dashed lines and for this resonator of the present invention shown in dark lines.

Currents flowing in the inner conductive rings 56, 58 therefore have magnitudes smaller than those of the outer rings. Given by $$I_n^{ri} = (1-p)\, I_o \cos\left(\frac{\pi}{N}\right)\cos\left(\frac{\pi(2n-1)}{N}\right)$$

they flow in opposite sense or direction about the coil axis from their respective outer rings. The circularly polarized field plots 101 and 103 of FIGS. 8a and 8b, respectively, were simulated assuming a factor p=0.25, which yield a Z-axis plot confirmed by field measurements of a working coil (coil diameter=26.7 cm and inner structure length=outer structure length=6.33 cm). The field plots 102 and 104 of FIGS. 8a and 8b, respectively, were simulated for a conventional two ring birdcage resonator of the same diameter and for a length of 19 cm, the same length as the four-ring resonator. The circularly polarized field plots of FIG. 8b are valid for the x- or y-directions and show approximately the same deviations (+20%) from the field value at the coil center at radii of 70% of the coil diameter, which is approximately the region occupied by an average head. Deviations in the roughly spherical volume occupied by a head are not greater than this. The field plots 101 and 103 of the four ring resonator shown in FIGS. 8a and 8b, respectively, exhibit much flatter profiles in the region of the coil center than 102 and 104 of the conventional birdcage resonator. The plots indicate that a conventional resonator substantially longer than the four ring resonator must be used to obtain an equivalent homogeneity along and in the region of the coil axis.

Figure 9:
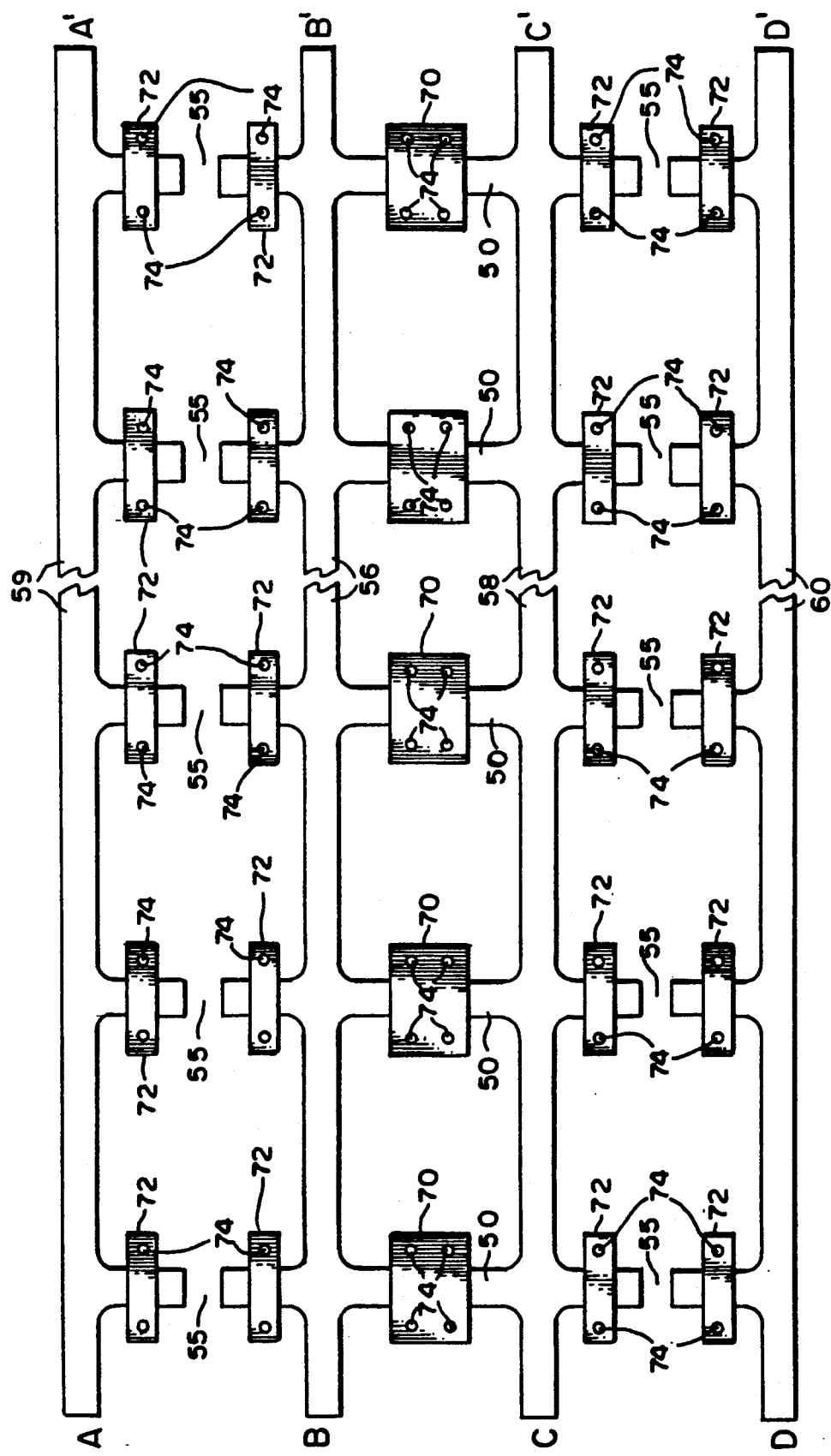
FIG. 9 depicts the preferred physical coil form of the present invention in a planar developed representation showing mounting supports utilized in the preferred embodiment.

FIG. 9 is a partial developed planar view of a portion of the coil pattern shown in FIG. 2a. The manner in which the physical form of FIG. 2a of the preferred resonator which in complete development has 16 segments, sized and implemented for NMR studies of the head will now be described. The construction of the resonator coil of the invention consisted of the following mechanical steps. Mechanically, the coil is designed to be mounted to a 26.7 cm (10.5 inch) o.d. lucite cylinder which is large enough to accommodate most head and nose sizes. The overall distance between the centers of the outer two conductive rings is 19 cm and that of inner two conductive rings is 6.33 cm. Flat metal sheets of 0.0021 inch thick electrically pure copper were used for construction of the conductive coil. The copper sheets were mounted on to a high precision milling machine, where the openings in the meshes for the inner and the two outer structures were cut. High precision milling was used to greatly reduce the tolerances between the adjacent meshes in the inner and outer structures respectively. As shown in FIG. 9, the meshes were cut in such a way that the conductive segments 50 and 52,54 and ring segments 56,58 and 59,60 of both the inner and outer structures were about 0.5" wide. The gaps in the outer ring segments 55 in FIG. 9 represent the slots where capacitors of appropriate values are mounted for tuning the respective structures. Three separate copper metal sheets, two of which form one half of the outer structure and the other of which includes the entire inner structure and half of each of the outer structures, were then mounted onto 10.5" outer diameter, 0.25" wall thickness lucite cylinder using lexan supports 70, 72 and nylon screws 74 tapped into the lucite cylinder 40 (FIG. 2a). As can be seen in FIG. 9, the wider rectangular supports 70 hold the upper conductive meshes and the strips 72 hold segments in place were reinforced by using nylon screws 74. Similarly, the outer structure segments were held by rectangular strips 72, reinforced by two nylon screws 74. The length of the nylon screws were adjusted in such a way that they no longer are a part of the inside cylindrical volume of the resonator.

The terminals A, B, C, and D were electrically connected to terminals A', B', C' and D' in order to make the four conductive rings continuous. To resonate in a static $B_o$ field of 1.5 Tesla, the resonator was tuned and the linear modes aligned with the drive points. Appropriate and identical value capacitors were placed in the two outer structure slots to tune the coupled outer structures to the selected frequency. Low value trimmer capacitors for tuning each of the four co-rotating linear modes were added across the fixed capacitors 62 and 64 of the outer structures at points corresponding to the alignment of the respective linear modes. Additional low-value trimmer capacitors were added at 45 degrees on each side of the tuning capacitors for adjustment of isolation, or mode alignment.

Conventional inductive loop, as well as capacitive, coupling methods may be used to couple power to and receive signals from the resonator of FIG. 2b. The inductive loop mounting structures were incorporated on the outside of the resonator and were designed in the usual manner taking into account the matched and mode isolation for the individual human head. A remote tuning and mode alignment scheme using capacitive coupling to the capacitors 66 has been developed for a phosphorus birdcage resonator of 26.7 cm diameter, 12.5 cm long length, and tuned to 26 MHz. See J. Murphy-Boesch et al., Abstract: Society of Magnetic Resonance in Medicine, Eighth Annual Meeting, Vol. 2, p. 944, Society of Magnetic Resonance, Berkeley, Calif. 1989. A similar scheme could be used for differential capacitive coupling to the coil.

Figure 10:
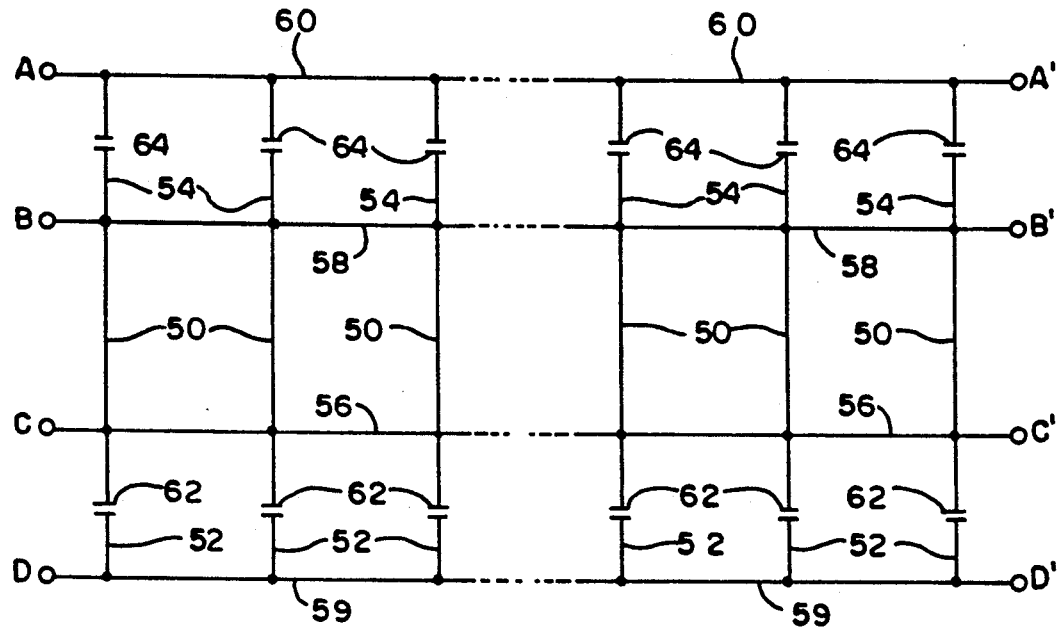
FIG. 10 is a schematic partial development of the preferred embodiment circuit from FIGS. 2b and 9 to provide direct comparison with the following figures.

Referring now to FIGS. 10, 13, 14 and 15 is will be observed that these figures illustrate alternative ways in which the resonator of the present invention illustrated and discussed above maybe implemented. FIG. 10 represents the four ring conductor structure having rings 56 and 58 as inner rings and 59 and 60 as outer rings. As in all the illustrations it will be appreciated that the rings are shown only partially and that they are closed into actual rings by connecting together terminals A and A', B and B', C and C' and D and D'. Each of the resonator configurations shown in FIGS. 10, 13, 14 and 15 have common ring configurations and each have the same ring designator except that the designators of FIG. 13 have an "a" suffix, those of FIG. 14, a "b" suffix and those of FIG. 15, a "c" suffix. Interconnecting the rings in FIG. 10 are segments generally parallel to the axis of the resonator. Segments 52 interconnect rings 56 and 59. Segments 54 interconnect rings 60 and 58 and segments 50 interconnect rings 56 and 58. As with the rings the interconnecting segments between the rings connecting the corresponding rings together are given the same number designators but with an "a⇌" suffix in FIG. 13, a "b" suffix in FIG. 14 and a "c" suffix in FIG. 15. Similarly each axial element 52 is interrupted by capacitor 62 and each axial element 54 is interrupted by a capacitor 64.

Figure 13:
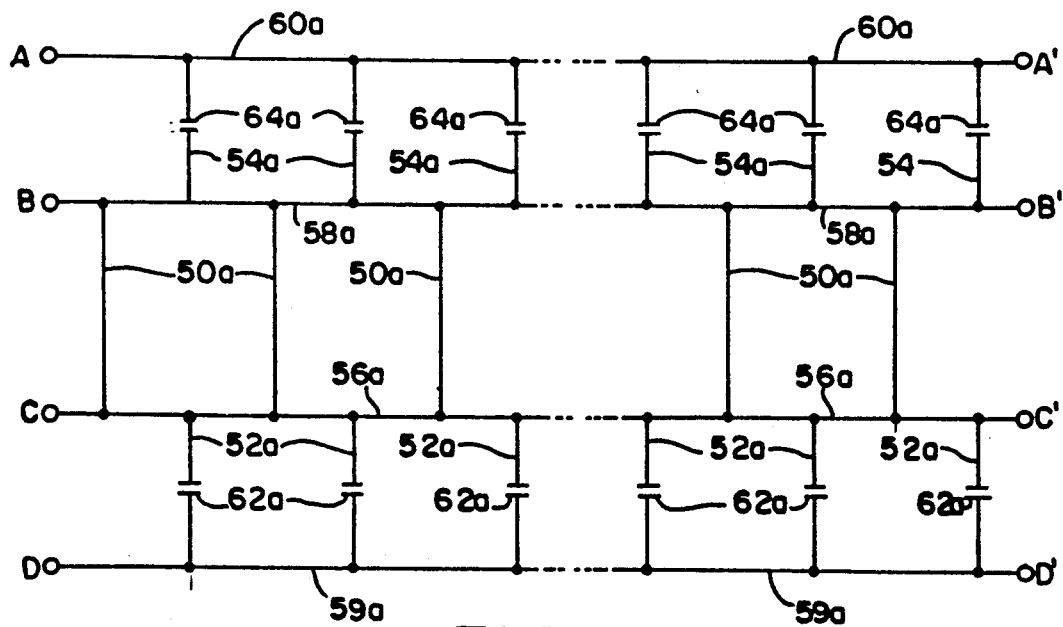
FIGS. 13, 14 and 15 are schematic partial developments similar to FIG. 10 showing alternative circuit configuration embodiments of the present invention.
Figure 14:
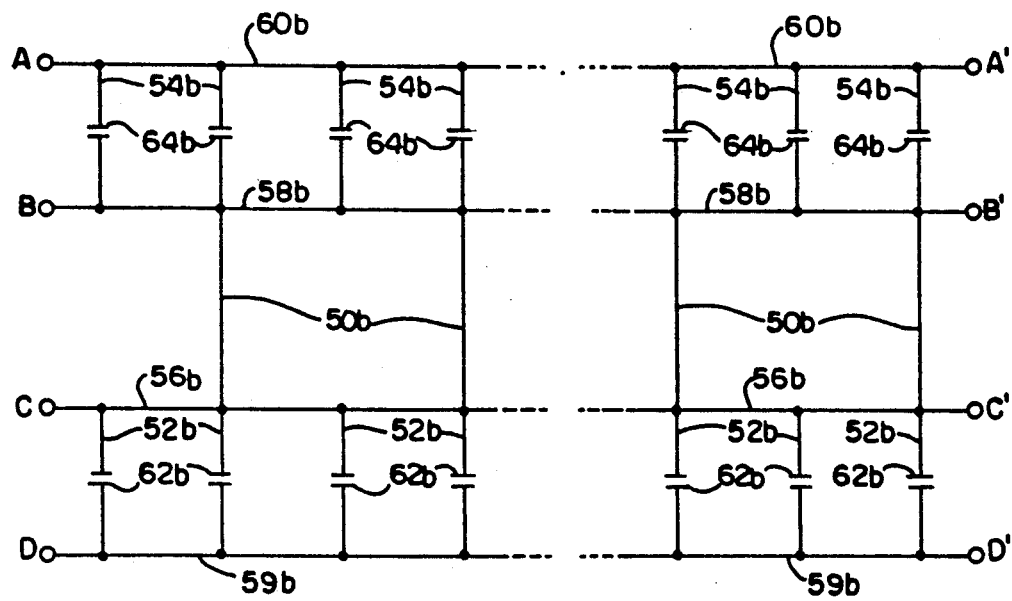
Figure 15:
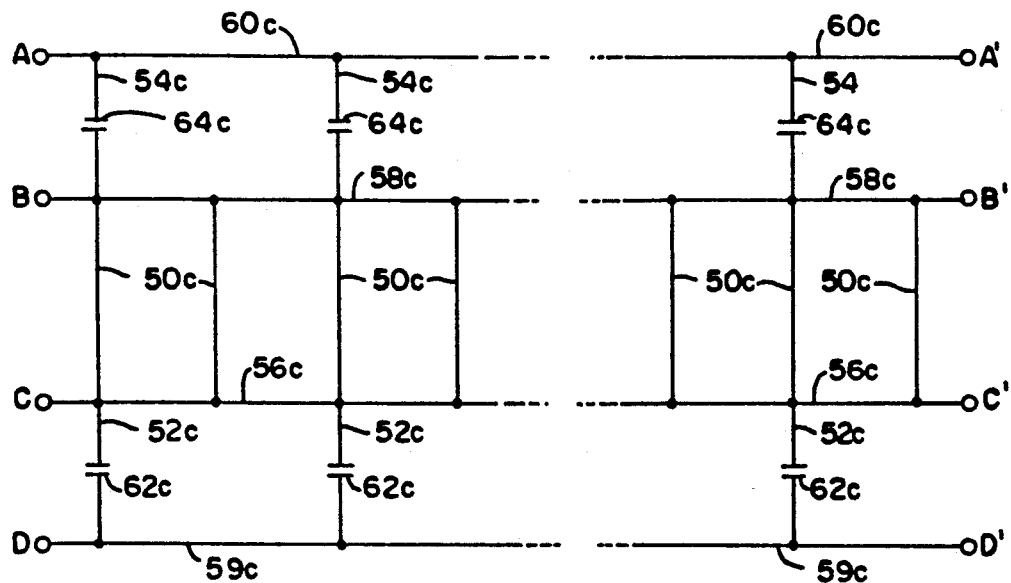

FIGS. 10, 13 14 and 15 have capacitors in essentially the same paths and are designated with the same number designators but with the suffix "a" in FIG. 13, "b" in FIG. 14, and "c" in FIG. 15. As with preferred embodiments of the structure described heretofore as illustrated in FIG. 10, each capacitor 64 in element 54 is of the same value and each capacitor 62 in each element 52 is of the same value. In co-rotating embodiments similar to that illustrated in FIG. 7b capacitors 62 and 64 have the same value, just as capacitors 62 and 64 do in the present preferred embodiment of FIG. 10, capacitors 62a and 64a in FIG. 13, capacitors 62b and 64b in FIG. 14, and capacitors 62c and 64c in FIG. 15 do in such embodiment.

FIGS. 10, 13, 14 and 15 are provided to show the versatility of the system considering coils of the same overall dimensions. FIG. 13 shows that unlike FIG. 10 the segments 50a do not have to be lined up with the segments 52a and 54a in order for the structure to function. The circulating currents within an individual loop will remain essentially the same in FIGS. 10 and 13. For similar size coils and identical value capacitors both the structures of FIGS. 10 and 13 will resonate at the same NMR frequencies. FIG. 14 presents a somewhat different circulation pattern with only half as many elements 50b. All circulating current loops in the resonator retain the same sense but require different values of capacitors for producing the same NMR resonant frequencies. The circulating current loops in the outer resonators of FIG. 14 retain the same sense but require slightly different values of capacitors for producing the same NMR resonant frequency.

The three figures show among other things that repositioning of segments either as in FIG. 10 or in FIG. 13 does not destroy operability. The number of interconnecting segments can even be different in the inner resonator and the outer resonators as shown in FIG. 15. The resonators described in the preferred embodiment included sixteen connecting segments for each resonator band. The outer resonators in FIG. 15 include only eight. Although there are advantages in using the sixteen over eight, the structure of FIG. 15 works very well. In theory, at least four generally parallel high frequency current paths connected to each of the adjacent ring paths is required for the structure to be operable in circularly polarized mode. $B_1$ homogeneity may be improved by increasing the number of such paths in most cases. However, in any event at least four such paths connecting each pair of rings is required for operability.

Alternatively capacitors may be shifted into the ring segments 59 and 60 making the outer bands single-ended high pass.

Figure 11:
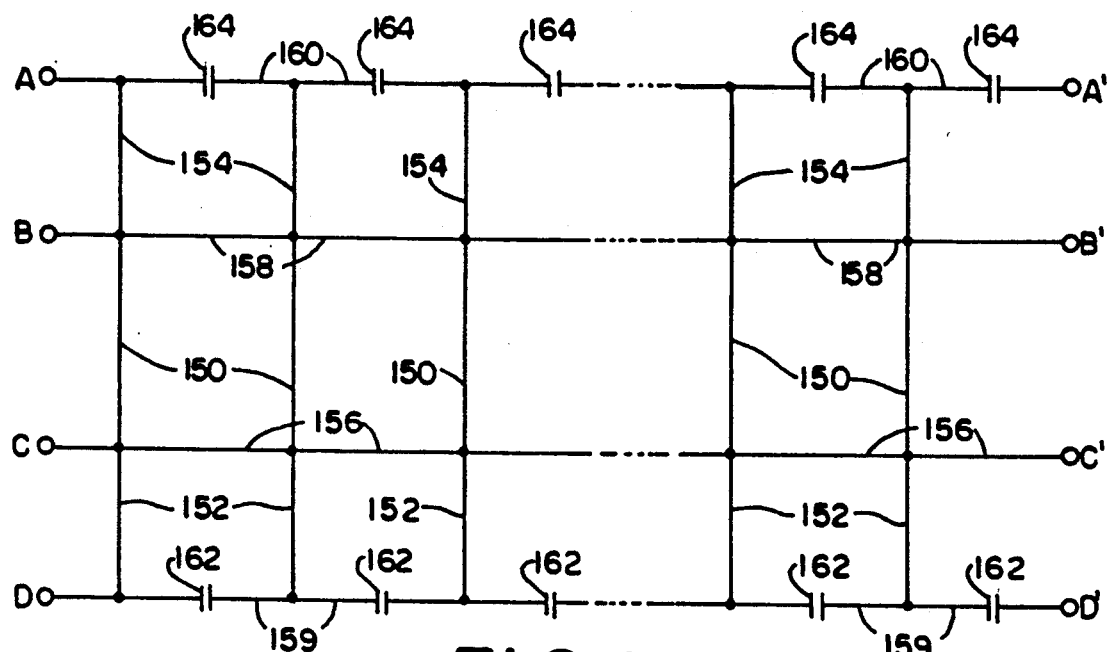
FIG. 11 depicts a partial planar schematic embodiment of the resonator of the present invention which may be referred to as the four ring single ended high pass volume resonator.
Figure 12:
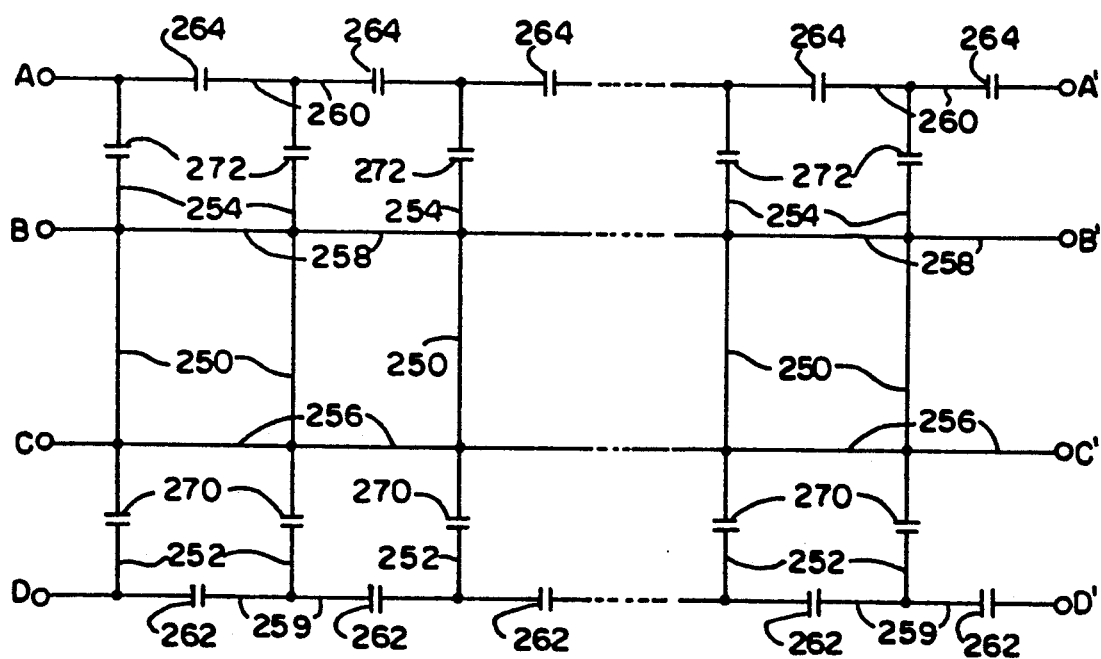
FIG. 12 depicts yet another partial planar schematic embodiment of the resonator of the present invention which may be referred to as the four ring band pass volume, resonator.

FIGS. 11 and 12 also show variations on the structure of FIG. 10. In accordance with the present invention, capacitance is permitted to be placed in the outside loop, but cannot be included in the inside loops between rings 56 and 58. In FIG. 11 two single-ended high-pass resonant structures are shown as described above. In FIG. 11, which shows corresponding parts with a prefix of 100, the capacitors 162 and 164 respectively are placed in the outer rings 159 and 160 between the parallel conductive elements 152 and 154, respectively.

FIG. 12, which shows a hybrid circuit with similar parts being given a prefix of 200. FIG. 12 has capacitors 262 and 264 in corresponding locations to those in FIG. 11 and additionally has capacitors 270 and 272 in locations corresponding to those in FIG. 10. Thus it has a combination of low-pass and single-ended high pass, but together producing a single-ended band-pass resonator for each outer structure. The end conductive rings 262, 264 are provided with capacitors that have the same values; the capacitors 270, 272 in the conductive segments 252, 254 are of the same value but differ from those in the conductive end rings 262, 264.

If the resonator of FIG. 10 is to be a dual frequency co-rotating structure capacitors 62 and 64 will not have the same value about the coil axis, but preferably will have the same value on corresponding straight segments. Alternatively, each outer structure can be tuned to widely separated frequencies, such as for different nuclei, and driven in either linear or circularly polarized mode. However, this mode of operation does not provide $B_1$ field homogeneity over a common region of the sample.

It is well known that increasing the capacitance on opposite sides of a single-tuned birdcage resonator and decreasing the capacitance on the sides in quadrature with the first, such as by superposing a cos 2 $\phi$ variation in capacitance upon an average capacitance value, will result in two quadrature linear modes tuned to widely separated frequencies. See U.S. Pat. No. 4,694,255 and P. Joseph and D. Lu IEEE Trans. Med. Imaging 8, 286–294 (1989). Each outer structure could be doubly tuned in this manner to two frequencies. For example, the two linear modes of the resonator could be tuned to the frequencies of carbon-13 (C-13) and phosphorus-31. A cylindrical resonator of this type is advantageous in that the RF fields at both frequencies are substantially homogeneous across a cylindrical sample located concentrically in the coil interior. Similarly, it is contemplated that each of linear modes of the outer structure pair could be tuned to separate frequencies, forming maximally a quadruple resonant coil. In these modes of operation the field is less homogeneous within the coil interior. Operation of the resonator in these various electrical modes in conjunction with various modifications to the form of the coil described above, such as use of the two-fold symmetry of an elipse, will be apparent to those skilled in the art.

Referring to FIGS. 2a and 2b, it will be recognized that the inner conductive rings 56,58 need not be of the same size and shape as the outer conductive rings 59,60. Furthermore, conductive rings 56,58,59,60 need not be precisely circular but may be ellipsoidal or of some other geometric form capable of accommodating the sample. By this logic, it will also be recognized that conductive segments 50 and 52, 54 need not be straight or parallel to each other and the longitudinal axis nor need they be equally spaced. It is only necessary that the geometry not render impossible or impractical the desired orientation and tuning of the linear modes of the resonator.

Although numerous modifications and variations of the invention have been shown and described it will be understood by those skilled in the art that many more will be apparent. All such modifications and variations within the scope of the claims are intended to be within the scope and spirit of the present invention.

We claim:

1. An RF resonator for use in NMR comprising:
   four coaxial high frequency ring current paths distributed along the axis thereby defined, ring current paths at each end of the resonator being outer ring current paths and other ring current paths being inner ring current paths;
   at least four high frequency current paths interconnecting each pair of at least three pairs or ring current paths, adjacent interconnecting paths forming current loops with connecting segments or ring current paths, loops between and including an outer ring current path and an inner ring current path defining an outer structure and loops between and including the inner ring current paths comprising an inner structure; and
   at least one discrete capacitor interposed in and interrupting each current loop in each outer structure, whereby in combination with the inductance in each loop, including inherent inductance in conductors of the current paths, each loop in the outer structure is resonant, but such that each loop in the inner structure is not interrupted by a capacitor so that no loop in the inner structure alone is resonant.

2. An RF resonator of generally cylindrical form for use in NMR comprising;
   four coaxial ring high frequency current paths distributed along the cylindrical axis thereby defined, ring current paths at each end of the resonator being outer ring current paths and other ring current paths being inner ring current paths;
   at least four generally parallel high frequency current paths connected to each of the adjacent ring paths, adjacent parallel paths and adjacent ring paths forming current loops between and including an outer ring current path and an inner ring current path defining an outer structure and loops between and including the two inner ring current paths comprising an inner structure; and at least one discrete capacitor interposed in and interrupting each loop in each outer structure, provided that no capacitor is interposed in and interrupting any loop of the inner structure, whereby in combination with the inductance in each loop, including inherent inductance in current paths, resonant frequencies are defined for each other loop, but none exists for each inner loop by itself.

3. A RF resonator of generally cylindrical form for use in NMR comprising:
three coaxial, axially distributed adjacent closed bands of repeated circuits provided by conductors surrounding openings forming electrical meshes, and each of the outer bands sharing a conductor with the inner band;
each of the meshes being formed so that circuits surrounding adjacent meshes in each band share a conductive path and adjacent bands share conductive paths, each circuit surrounding each mesh in the two outer bands having at least one discrete capacitor interposed in and interrupting the circuit, provided that the capacitor cannot be in the conductive path shared with the inner band, whereby a selected NMR resonant frequency is achieved in each outer band by the combination of inductance in the mesh, including inherent inductance in conductors, and the individual meshes in the inner band contain no capacitance have no resonant frequency.

4. An RF resonator of generally cylindrical form for use in an NMR comprising:
a thin conductor sheet on a tubular insulating support provided with periodic openings at three axial levels all openings at the same axial level around the resonator being of the same size, such that symmetrical conductive circuits are provided surrounding each of the openings, gaps in the conductor sheet at least one place around each opening at the outside to axial levels with a discrete capacitor being provided to span the gap, the capacitors being arranged symmetrically at each axial level whereby the capacitance in each loop containing capacitors together with inherent inductance produces resonant frequency circuits together forming a cylindrical resonator such that no gap and no capacitor is included in the periodic opening at the center axial level.

5. An RF resonator for use in NMR comprising:
two coaxial birdcage coils axially spaced from one another, each having a pair of high frequency ring current paths interconnected by at least four high frequency current paths;
at least four high frequency current paths interconnecting the most proximate ring current paths of the birdcage coils; and
at least one discrete capacitor interposed in and interrupting each current loop of each birdcage provided that there are no capacitors in either of the inner ring current loops, whereby in combination with the inductance in each loop, including inherent inductance in the conductors, each loop of each birdcage coil is resonant.

6. The RF resonator of claim 1 in which the resonator has axial symmetry in that the structure in each of the four quadrants around the axis is the same as every other quadrant.

7. The RF resonator of claim 1 in which the resonator has symmetry on both sides of a medial plane normal to the axis of the ring current paths.

8. The RF resonator of claim 1 in which the resonator has axial symmetry in that the structure in each of the two half planes around the axis is the same as the other half plane and the location of input/output selected such that the resonator may be driven in circular polarized mode at one NMR frequency or in linearly polarized mode at up to two NMR frequencies.

9. The RF resonator of claim 6 in which the resonator has symmetry on both sides of a medial plane normal to the axis of the ring current paths.

10. The RF resonator of claim 6 in which the current paths interconnecting each pair of ring current paths are equally spaced from one another.

11. The RF resonator of claim 10 in which the capacitors in all loops between any two ring current paths have essentially the same value.

12. The RF resonator of claim 10 in which each of the outer loops employs capacitors of unequal value.

13. The RF resonator of claim 10 in which the two bands of outer current loops have identical value capacitors.

14. The RF resonator of claim 10 in which the capacitors in those loops between any two ring current paths do not have essentially the same value.

15. The RF resonator of claim 10 in which each outer structure between and including an inner ring path and its adjacent outer ring path employs unequal value capacitors and each corresponding circumferential position around the resonator and the inner structure between and including two inner ring current paths has identical value capacitors in all its loops.

16. The RF resonator of claim 11 in which only four ring current paths are employed defining inner structure between and including the two inner ring current paths and outer structure between and including the respective outer and adjacent inner ring current paths and capacitances in the outer loops of no more than two values are employed.

17. The RF resonator of claim 16 in which only one value of capacitor is employed.

18. The RF resonator of claim 16 in which different values of capacitors are employed in the respective outer current loops at axially opposite ends of the resonator.

19. The RF resonator of claim 17 in which the outer structure current loops between the respective ring current paths are coupled through the high frequency current paths of the inner structure and tuned to one NMR frequency.

20. The RF resonator of claim 19 in which the resonator can be driven at one NMR frequency in either linearly polarized mode or circularly polarized mode.

21. The RF resonator of claim 19 in which input/output couplings to the respective outer structures produce a counter-rotating current distribution.

22. The RF resonator of claim 19 in which input/output couplings to the respective outer structures produce co-rotating current distributions in the outer current loops which produce a current distribution which spans the entire length of the resonator electrically coupled through the inner loops.

23. The RF resonator of claim 19 in which the outer structures have concentrated sinusoidal distribution of currents to produce a highly homogeneous Rf $B_1$ field along and in the region of the resonator axis without increasing coil length.

24. The RF resonator of claim 21 in which the input/output couplings to the respective outer structure produce counter-rotating current distributions are selected and arranged to produce no appreciable RF magnetic field axially at the center of the resonator.

25. The RF resonator of claim 21 in which the counter-rotating current distributions produce a highly linear gradient in the RF magnetic axially at the center of the resonator.

26. The RF resonator of claim 22 in which the co-rotating current distribution produces a substantially homogeneous RF $B_1$ field at the center of the resonator.

27. The RF resonator of claim 18 in which the values of capacitors employed are selected such that the resonator can be driven up to a maximum of two NMR frequencies in either linearly polarized mode or circularly polarized mode or in a combination of the above.

28. The RF resonator of claim 12 in which the values of the capacitors employed and location of input/output couplings to the outer structure are selected such that each outer band of loops can be driven in a circularly polarized mode for up to a maximum of two different NMR frequencies, and the resonator can be driven for up to a maximum of four separate NMR frequencies in linearly polarized mode.

29. The RF resonator of claim 13 in which the values of the capacitors employed and location of input/output couplings to the outer structure are selected such that the identical two bands of outer current loops, coupled through the inner structure can either be driven linearly or in circularly polarized mode in any one NMR frequency.

30. The RF resonator of claim 14 in which the values of the capacitors employed and location of input/output couplings to the outer structure are selected such that the resonator can be driven up to a maximum of four different NMR frequencies in a linearly polarized mode.

31. The RF resonator of claim 2 in which the resonator has axial symmetry in that the structure in each of the four quadrants around the axis is the same as every other quadrant.

32. The RF resonator of claim 2 in which the parallel paths in each set are spaced from one another of the ring current paths.

33. The RF resonator of claim 2 in which the values of the capacitors employed and location of input/output couplings are selected such that at least one interconnected pair of ring conductors has capacitors of essentially the same value so that resonances of its loop are at one selected NMR frequency whereby input/output couplings spaced essentially 90° apart about the axis produce a circularly polarized input at that frequency.

34. The RF resonator of claim 2 in which the respective loops defined by each of two outer interconnected pairs of ring current paths operate at a selected frequency different from the other but the loops within each of the respective outer pairs of ring current paths are capacitors of essentially the same value so that resonances of its loops are at one selected NMR frequency whereby input/output couplings spaced essentially 90° apart about the axis produce a circularly polarized input at that frequency.

35. The RF resonator of claim 2 in which the respective loops defined by each of two interconnected outer pairs of ring current paths have capacitors of essentially the same value so that resonances of its loop are at one selected NMR frequency whereby input/output couplings spaced essentially 90° apart about the axis produce a circularly polarized input at that frequency.

36. The RF resonator of claim 2 in which there are fewer parallel high frequency current paths between each of the outer two ring current paths than between the inner pair of ring current paths.

37. The RF resonator of claim 2 in which there are fewer parallel high frequency current paths between each of the inner two ring current paths than between the outer pair of ring current paths.

38. The RF resonator of claim 2 in which the parallel high frequency current paths connected to each of the adjacent ring current paths are aligned with one another.

39. The RF resonator of claim 2 in which the high frequency current paths between the respective pairs of ring current paths of the outer structure are aligned with one another and the high frequency current paths between the inner pair of ring current paths lie intermediate the high frequency current paths between the outer pairs of ring current paths.

40. The RF resonator of claim 2 in which the capacitors in each of the outer loops are placed in the parallel high frequency current paths connected to adjacent ring current paths between each of the respective outer pairs of ring current paths.

41. The RF resonator of claim 2 in which the capacitors in the outer loops are placed in the outer ring current paths between each adjacent pair of high frequency current paths.

42. The RF resonator of claim 31 in which the resonator has symmetry on both sides of a medial plane normal to the axis of the ring current paths.

43. The RF resonator of claim 31 in which the capacitors located in any loop are of a single particular capacitance.

44. The RF resonator of claim 32 in the parallel paths are equally spaced from one another.

45. The RF resonator of claim 35 in which a pair of input/output couplings are coupled to interconnecting current paths between the same outer pair of ring current paths.

46. The RF resonator of claim 35 in which one input/output couplings is coupled to one outer structure between one pair of outer ring current paths and another input/output couplings spaced 90° around the axis is coupled to the other outer structure between the other pair of outer ring current paths.

47. The RF resonator of claim 35 in which the two outer structures including the respective two ring current paths are coupled through the inner structure between the inner pair of ring current paths to produce a co-rotating current distribution which spans the entire length of the resonator.

48. The RF resonator of claim 35 in which the axially outer current loops between the respective ring current paths are arranged to generate counter-rotating current distribution.

49. The RF resonator of claim 35 in which the outer structure have concentrated sinusoidal distribution of currents to produce improved homogeneous Rf $B_1$ field along and in the region of the resonator axis without increasing resonator length.

50. The RF resonator of claim 45 in which separate pairs of input/output couplings are respectively coupled to interconnecting current paths between the respective outer pairs of ring current paths.

51. The RF resonator of claim 47 in which the co-rotating current distribution produces a homogeneous RF $B_1$ field at the center of the resonator.

52. The RF resonator of claim 48 in which the counter-rotating current distributions produce no appreciable $B_1$ field axially at the center of the resonator.

53. The RF resonator of claim 36 in which there are half as many parallel high frequency current paths between the respective outer pairs of ring current paths as between the inner pair of ring current paths.

54. The RF resonator of claim 53 in which the parallel high frequency current paths between the outer ring current paths are aligned with every other parallel high frequency current path between the ring current paths.

55. The RF resonator of claim 37 in which there are half as many parallel high frequency current paths between the respective inner pair of ring current paths as between each of the outer pairs of ring current paths.

56. The RF resonator of claim 55 in which the current paths between the inner ring current paths are aligned with alternate current path between the ring current paths of the outer structure.

57. The RF resonator of claim 41 in which there are also capacitors placed in each of the parallel high frequency current paths between an outer ring current path and an inner ring current path.

58. The RF resonator of claim 3 in which each of the meshes in each of the bands is substantially identical in width to one another and spaced to provide essentially identical conductor size.

59. The RF resonator of claim 58 in which capacitors are placed in the same position in each mesh.

60. The RF resonator of claim 15 in which the values of capacitors employed in the loops of the outer structure are selected such that the outer loops are tuned to two NMR frequencies, at least one of which frequencies is electrically coupled through the high frequency current paths of the inner loops.

61. The RF resonator of claim 15 in which the values of the capacitors employed and location of input/output couplings to the outer structure are selected such that the outer loops can be driven together linearly for up to a maximum of two different NMR frequencies in circularly polarized mode.

62. The RF resonator of claim 60 in which the values of the capacitors employed and location of couplings are selected such that the resonator can be driven in linear polarized mode at two NMR frequencies.

63. The RF resonator of claim 60 in which the values of the capacitors employed and location of input/output couplings to the outer structure are selected such that two co-rotating current distributions in the axially outer current structure produce current distributions coupled through the inner structure which span the entire length of the resonator.

64. The RF resonator of claim 60 in which the values of the capacitors employed and location of input/output couplings are selected such that the axially outer structures between their respective ring current paths have two counter-rotating current distributions.

65. The RF resonator of claim 28 in which the values of the capacitors employed and location of input/output couplings to the outer structure are selected such that each co-rotating current distribution produces a substantially homogeneous RF $B_1$ field at the center of the resonator.

66. The RF resonator of claim 64 in which the values of the capacitors employed and location of input/output couplings to the outer structure are selected such that the counter-rotating current distributions produce no appreciable $B_1$ field axially at the center of the resonator.

67. The RF resonator of claim 64 in which the values of the capacitors employed and location of input/output couplings to the outer structure are selected such that the counter-rotating current distributions produce highly linear gradients in the $B_1$ field axially at the center of the resonator.

* * * * *